US012469717B2

(12) United States Patent
Chen et al.

(10) Patent No.: US 12,469,717 B2
(45) Date of Patent: Nov. 11, 2025

(54) SYSTEMS, METHODS, AND SEMICONDUCTOR DEVICES

(71) Applicant: Taiwan Semiconductor Manufacturing Co., Ltd., Hsinchu (TW)

(72) Inventors: Tz-Shian Chen, Hsinchu (TW); Li-Ting Wang, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 768 days.

(21) Appl. No.: 17/459,043

(22) Filed: Aug. 27, 2021

(65) Prior Publication Data
US 2023/0061802 A1    Mar. 2, 2023

(51) Int. Cl.
*H01L 21/324*    (2006.01)
*H01L 21/66*    (2006.01)

(52) U.S. Cl.
CPC ............ *H01L 21/324* (2013.01); *H01L 22/12* (2013.01)

(58) Field of Classification Search
CPC ....... H01L 21/324; H01L 22/12; H01L 22/20; H01L 21/67248; H01L 21/268; H01L 21/67115; H01L 21/67098
See application file for complete search history.

(56) References Cited

U.S. PATENT DOCUMENTS

| | | | | |
|---|---|---|---|---|
| 8,753,904 B2* | 6/2014 | Tsai | .................. | G01B 11/14 257/E21.001 |
| 8,883,522 B2* | 11/2014 | Tsai | .................. | G01B 11/14 356/614 |
| 9,482,518 B2* | 11/2016 | Tsai | .................. | H01L 22/12 |
| 11,158,510 B2* | 10/2021 | Lee | .................. | G01N 21/25 |
| 11,764,064 B2* | 9/2023 | Lee | .................. | H01L 22/12 438/795 |
| 2004/0212798 A1* | 10/2004 | Cheng | .................. | G01N 21/55 356/240.1 |
| 2013/0196455 A1* | 8/2013 | Shen | .................. | B23K 26/0608 257/E21.333 |
| 2013/0330847 A1* | 12/2013 | Tsai | .................. | H01L 22/20 257/E21.53 |
| 2015/0292868 A1* | 10/2015 | Tsai | .................. | G01B 11/14 356/612 |
| 2019/0157119 A1* | 5/2019 | Yeh | .................. | H01L 21/324 |
| 2020/0075338 A1* | 3/2020 | Lee | .................. | G01N 21/55 |
| 2022/0076957 A1* | 3/2022 | Lee | .................. | G01N 21/55 |

(Continued)

FOREIGN PATENT DOCUMENTS

| | | | | |
|---|---|---|---|---|
| JP | 11-135452 | * | 10/2021 | ........... H01L 21/268 |
| KR | 10-2015-0056269 | * | 5/2015 | ....... H01L 21/67248 |
| WO | WO 2017/114424 | * | 7/2017 | ........... H01L 21/268 |

*Primary Examiner* — Mary A Wilczewski
(74) *Attorney, Agent, or Firm* — Slater Matsil, LLP

(57) ABSTRACT

A method of manufacturing a semiconductor device includes: determining a first reflectivity of a first anneal region on a wafer; determining a second reflectivity of a second anneal region on the wafer, performing a first laser shot on the first anneal region, measuring a first temperature of the first anneal region, and performing a second laser shot on a second anneal region. A power of the first laser shot is set in accordance with the first reflectivity. A power of the second laser shot is set in accordance with the second reflectivity.

18 Claims, 21 Drawing Sheets

(56) References Cited

U.S. PATENT DOCUMENTS

2023/0061802 A1* 3/2023 Chen ................. H01L 21/324
2023/0170256 A1* 6/2023 Bo ..................... H01L 21/77
　　　　　　　　　　　　　　　　　　　　438/197
2023/0377915 A1* 11/2023 Wang ............... H01L 21/67253

* cited by examiner

SYSTEMS, METHODS, AND SEMICONDUCTOR DEVICES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes in combination with dopant implantation and thermal annealing techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes and techniques that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
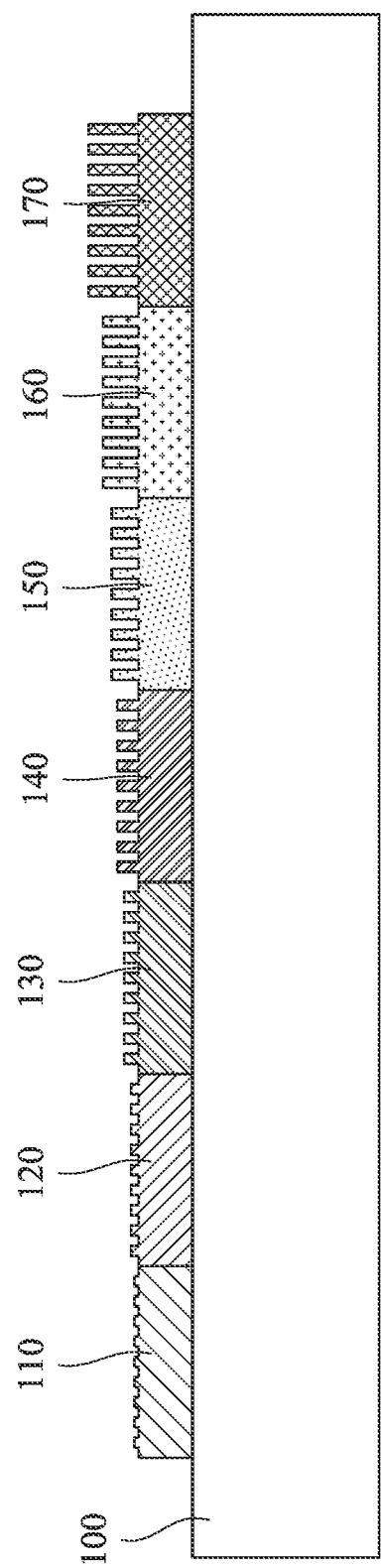
FIGS. 1A and 1B illustrate cross-sectional and top-views of a wafer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer annealing system is provided in accordance with various exemplary embodiments. Wafers may be heated to desired temperatures by annealing with laser shots. For some thermal treatments such as e.g. thermal treatments intended to improve the properties of similar features on a wafer, it may be useful to achieve a uniform temperature across the wafer in order to uniformly improve the properties of the features. However, anneals performed by laser shots on the wafer may result in differing maximum temperatures being reached in different positions of the wafer, which may be due to areas of the wafer having differing reflectivities. The wafer annealing system may allow for the uniform heating of wafers across wafer regions with different reflectivities.

Figure 1B:
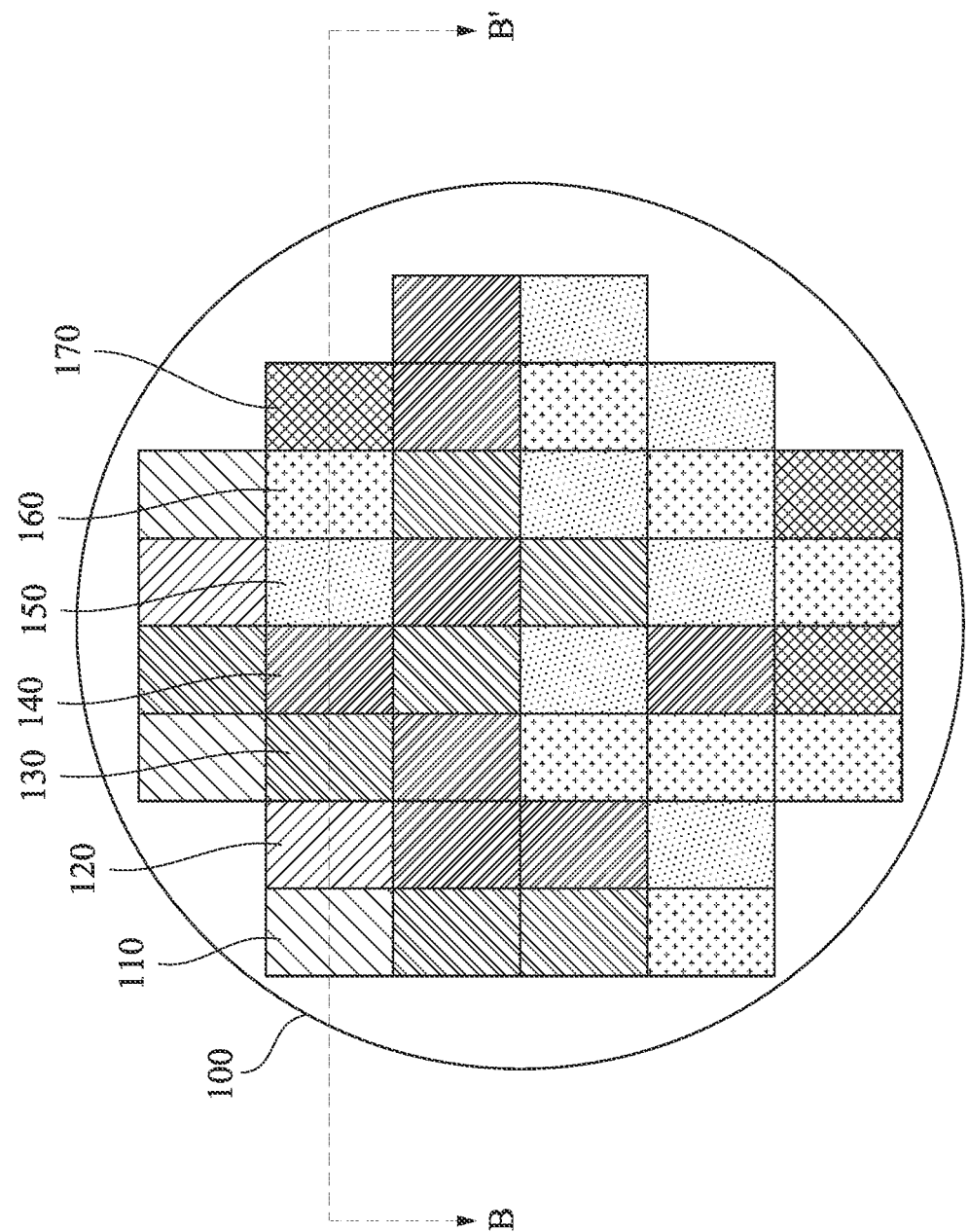

FIGS. 1A and 1B illustrate cross-sectional and top views of a wafer 100, with FIG. 1A illustrated along a cross-section B-B' as shown in FIG. 1B. The wafer 100 may be a semiconductor wafer, such as a silicon wafer. A plurality of semiconductor devices and structures may be formed on the wafer 100, such as e.g. transistors, redistribution layers and structures, in order to form one or more semiconductor dies, such as logic dies including central processing units (CPUs) or graphics processing units (GPUs), memory cells and arrays including e.g. static random access memory (SRAM) arrays. In other embodiments the semiconductor dies may be a system-on-a-chip (SoC), an application processor (AP), a microcontroller, a memory die (e.g., dynamic random access memory (DRAM) die, SRAM die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. Any suitable semiconductor device may be utilized.

As illustrated in FIG. 1A, structures on the top surface of the wafer 100 may result in different reflectivities. For example, a first area 110 on the left side of the wafer 100 has structures with relatively smaller aspect ratios protruding from the top surface of the wafer 100, which may lead to the first area 110 having a relatively high reflectivity. Additionally, a second area 120, a third area 130, a fourth area 140, a fifth area 150, a sixth area 160, and a seventh area 170 may have progressively larger aspect ratios of the structures protruding from their respective surfaces, which may lead to the second area 120, the third area 130, the fourth area 140, the fifth area 150, the sixth area 160, and the seventh area 170 having progressively lower reflectivities than the first area 110, with the seventh area 170 having the lowest reflectivity. The structures shown in FIG. 1A are presented for illustrative purposes and embodiments include any suitable ordering of structures with different aspect ratios and areas with different reflectivities.

FIG. 1B illustrates a top view of the wafer 100, showing a distribution of areas with different reflectivities. Areas with relatively high reflectivity such as the first area 110 and the second area 120 may include e.g. memory arrays such as SRAM. Areas with median reflectivity such as the third area 130, the fourth area 140, and the fifth area 150 may include e.g. GPUs or SoCs. Areas with relatively low reflectivity such as the sixth area 160 and the seventh area 170 may include e.g. CPUs. However, any suitable structures may be utilized.

Because the areas of the wafer 100 have different reflectivities, laser anneals performed on the wafer 100 with a same power may result in different temperatures being reached for areas on the wafer 100 with different reflectivities. In order to achieve a more uniform temperature across the wafer 100, a wafer anneal system using measurements of the reflectivities of areas of the wafer 100 to adjust the power of laser shots used on each respective area may be used. This approach may enlarge the flow integration window of the anneal process.

Figure 2:
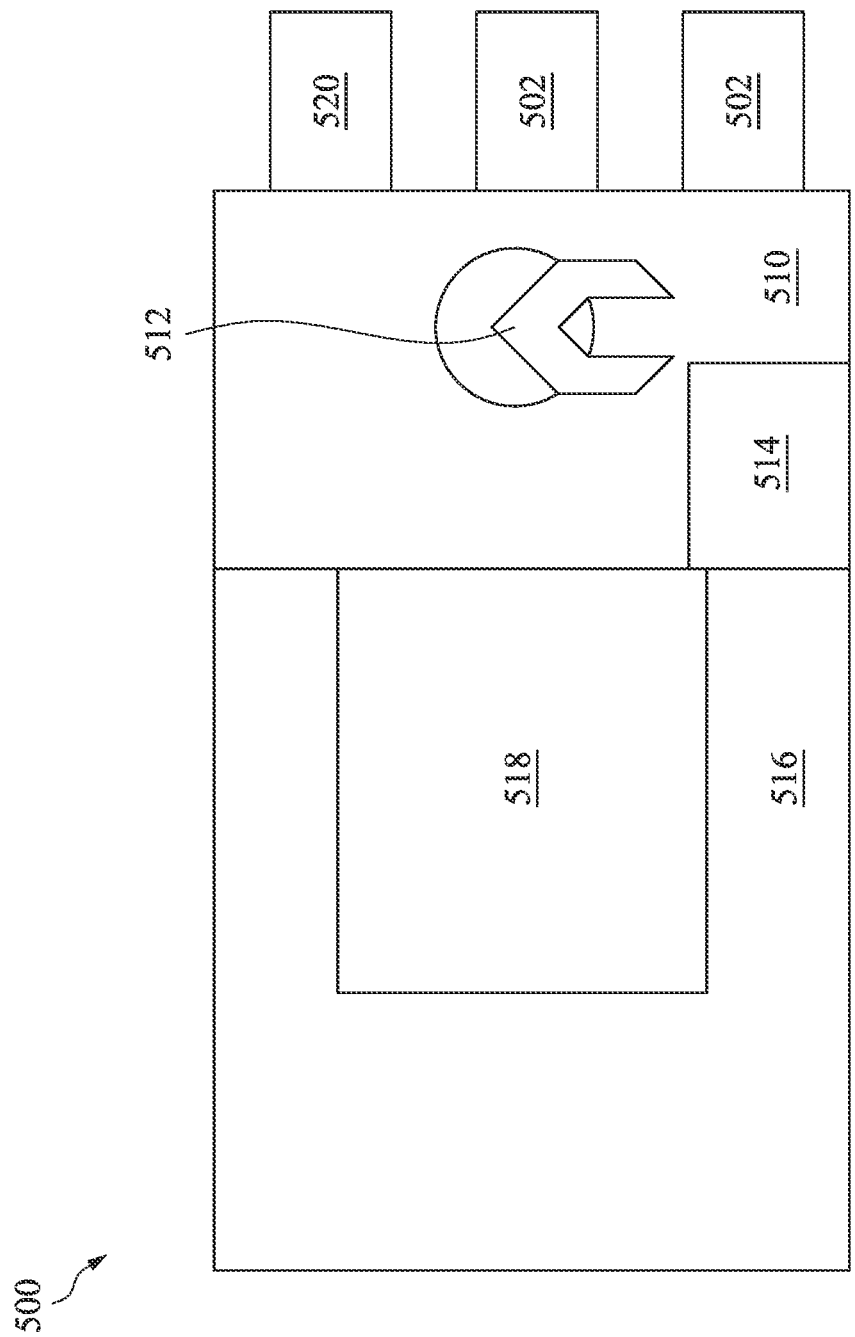
FIG. 2 illustrates a top-view of an annealing tool, in accordance with some embodiments.

FIG. 2 illustrates a top view of an annealing tool 500. The process flow in accordance with the embodiments is briefly described below, and the details of the process flow and the annealing tool 500 are discussed, referencing FIGS. 3 through 9. The annealing tool 500 comprises loading stations 502, a cooling station 520, a handling chamber 510 comprising a handler 512 and an alignment module 514, and an apparatus chamber 516 comprising a process chamber 518 (see below, FIG. 3).

Loading stations 502 are used to load wafers into the handling chamber 510 of the annealing tool 500. In some embodiments, the loading stations 502 are front opening unified pods (FOUPs). The handler 512 in the handling chamber 510 may be used to take the wafer 100 from the loading station 502 and move the wafer 100 through the various processes and process chambers in the annealing tool 500. The handler 512 may include several different robotic arms located in different areas of the handling chamber 510.

The handler 512 moves the wafer 100 from the loading station 502 to the alignment module 514. In an embodiment the alignment module 514 may comprise one or more rotating arms which can rotate or maneuver the wafer 100 to any desired position (not separately illustrated for clarity). The wafer is then moved by the handler 512 to the process chamber 518 for a measurement and annealing process, such as described below in respect to FIGS. 3A through 5.

Figure 3A:
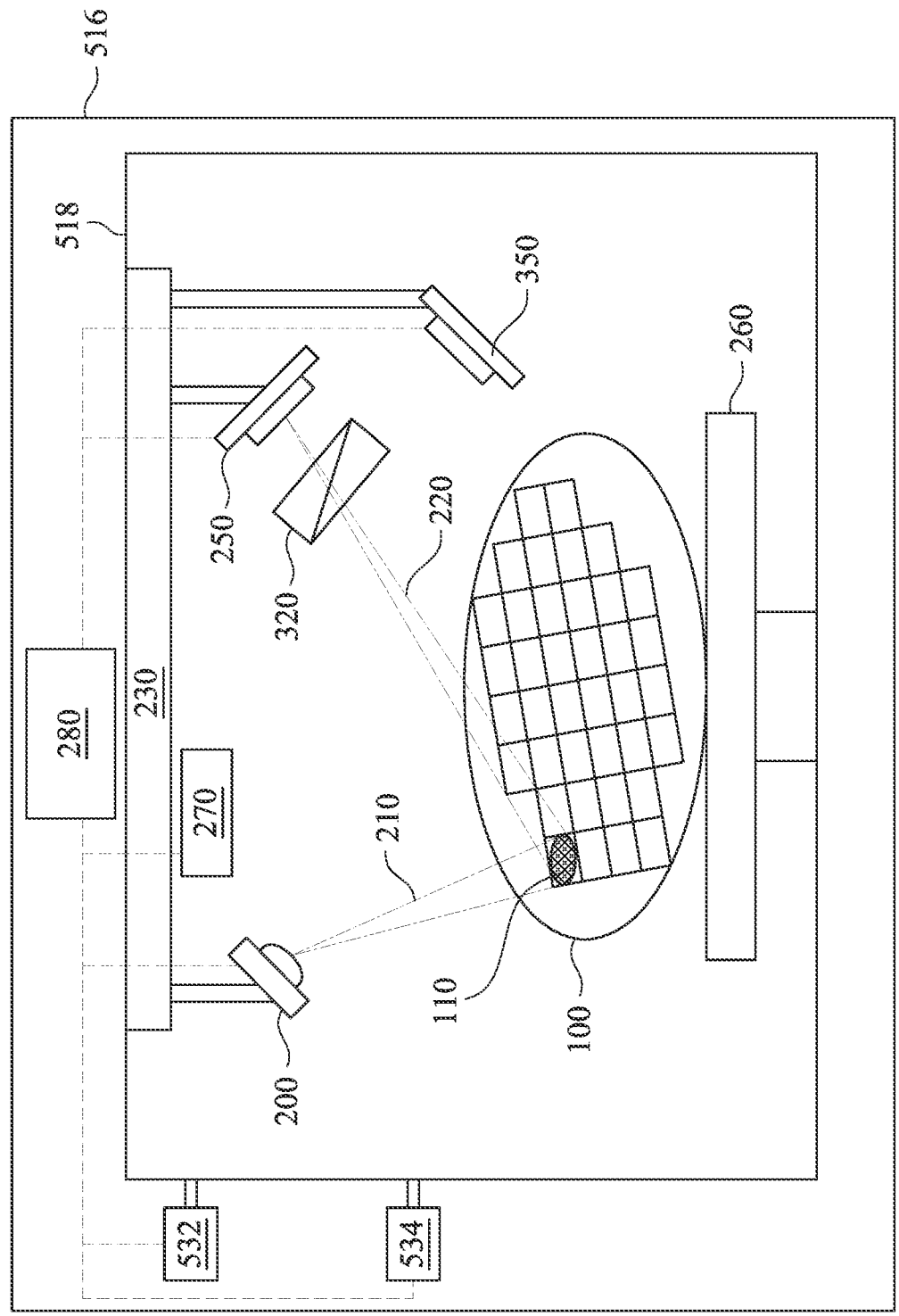
FIGS. 3A, 3B, and 3C illustrate perspective views of intermediate steps in a measuring process, in accordance with some embodiments.

FIG. 3A illustrates the process chamber 518 in the apparatus chamber 516, which may be used to perform both reflectivity measurements and laser annealing. The process chamber 518 may be a vacuum environment (a vacuum chamber), and may be any desired shape for contacting a laser with the wafer 100. As such, while the process chamber 518 may be any suitable material that can withstand the ambient environment (e.g., temperatures and pressures) involved in a reflectivity measurement and/or laser annealing process, in an embodiment the process chamber 518 may be steel, stainless steel, nickel, aluminum, alloys of these, combinations of these, and the like.

Within the process chamber 518 is located a mounting platform 260 in order to position and control the wafer 100 during the reflectivity measurements and/or laser annealing. The mounting platform 260 may hold the wafer 100 using a combination of clamps, vacuum pressure, and/or electrostatic forces, and may also include heating and cooling mechanisms in order to control the temperature of the wafer 100 during the processes. The mounting platform 260 may be attached to a moveable stage (not illustrated), which may allow the mounting platform 260 to be moved to different positions in respect to a laser generator 270 (see below).

The laser generator 270 may be positioned in the process chamber 518 above the mounting platform 260 in order to perform laser shots on the wafer 100. In some embodiments, the laser generator 270 is attached to a moveable frame. The laser generator 270 may produce a laser beam with a wavelength in a range of 190 nm to 10700 nm, such as 308 nm. However, any suitable wavelength may be utilized.

Operations of the process chamber 518 may be controlled by a controller 280. In some embodiments, the controller 280 comprises a programmable computer. The controller 280 is illustrated as a single element for illustrative purposes. In some embodiments, the controller 280 comprises multiple elements. The controller 280 may be located in the apparatus chamber 516.

A gas inlet 532 and a gas outlet 534 may be connected to the process chamber 518. The gas inlet 532 may supply a gas such as nitrogen, oxygen, hydrogen, ammonia, argon, the like, or a combination thereof during the reflectivity measurement and/or laser annealing process. The gas supply may be located in the apparatus chamber 516. An ambient pressure inside the process chamber 518 can be controlled by flowing gas/air into the process chamber 518 through the gas inlet 532 and removing gas/air from the process chamber 518 via the gas outlet 534 through the use of one or more vacuum pumps (not illustrated) in the apparatus chamber 516 and connected to the gas outlet 534. The pressure of the process chamber 518 can be controlled such that a pressure in the process chamber 518 may range from a vacuum to above 1 atmosphere. In some embodiments, the pressure of the process chamber 518 may be controlled to be in a range of 5 torr to 1000 torr during the reflectivity measurement and/or laser annealing process.

A probe laser 200 is positioned above the mounting platform 260. The probe laser 200 may be attached to a moveable arm on a moveable frame 230 in order to individually target any desired areas of the wafer 100, such as e.g. the first area 110. The probe laser 200 may be used for producing laser shots for measuring the reflectivity of the wafer 100. The probe laser 200 may be connected to the controller 280. The probe laser 200 may produce a laser beam with a wavelength in a range of 600 nm to 1000 nm, such as about 638 nm, although any suitable wavelength may be utilized. The probe laser 200 may be a polarized source or include a polarizer set directly in front of the laser source.

Figure 3B:
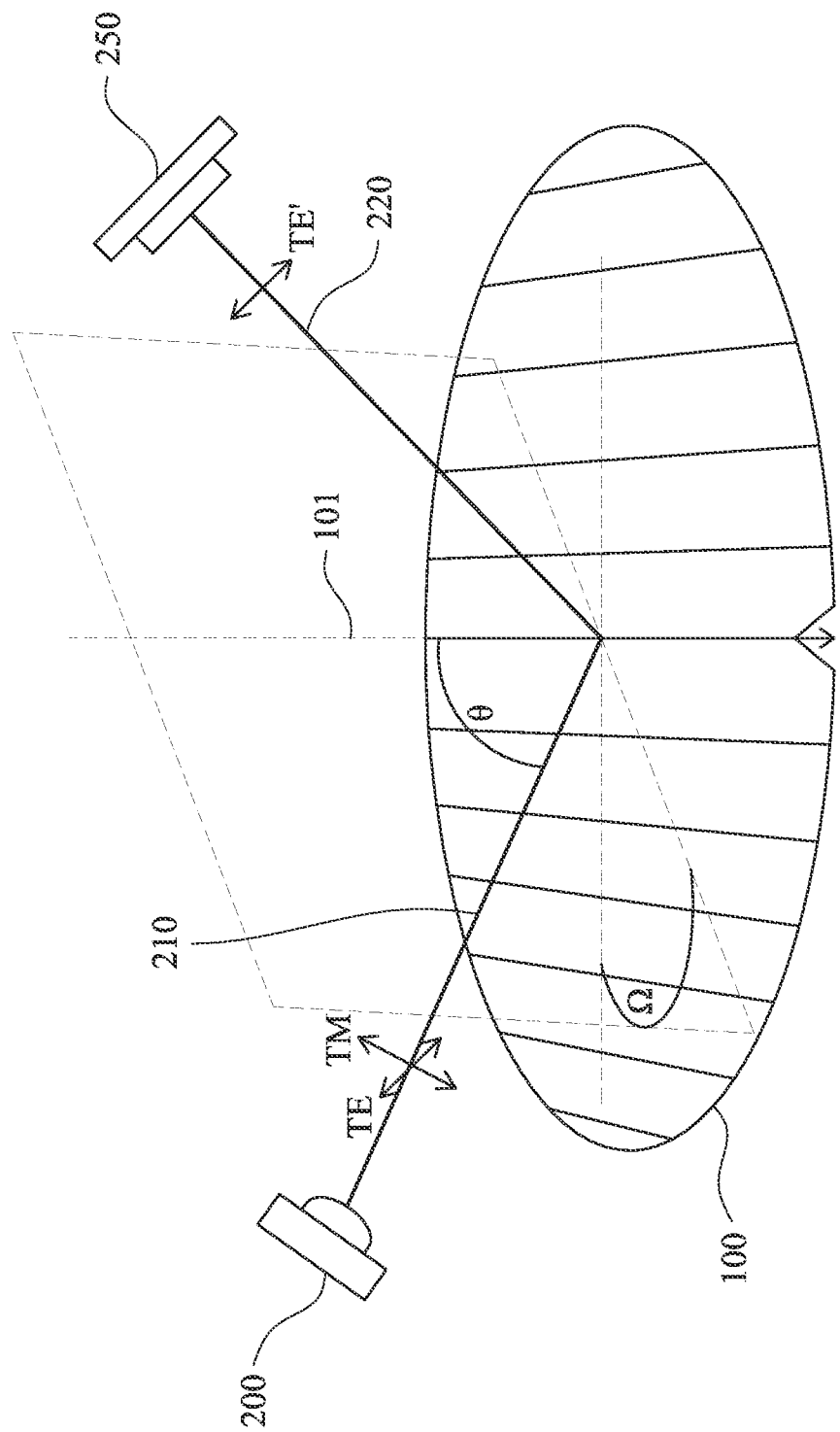

FIG. 3B illustrates ranges of incidences of a laser beam 210 from the probe laser 200 on the wafer 100. The probe laser 200 may have a tilt angle θ measured between the laser beam 210 issuing from the probe laser 200 and a vertical direction perpendicular to a top surface of the wafer 100 in a range of 10° to 80°, so that the laser beam has oblique incidence on the wafer 100. The laser beam 210 may also have an angle Ω in a range of 0° to 85° measured between the direction of the laser beam 210 and a long axis 101 of the pattern on the top surface of the wafer 100. The laser beam 210 may have S polarization, also referred to as being transverse-electric (TE), with the electric field of the laser beam 210 being normal to the plane of incidence on the wafer 100; the laser beam 210 may also have P polarization, also referred to as being transverse-magnetic (TM), with the electric field of the laser beam along the plane of incidence on the wafer 100.

Returning to FIG. 3A, a first pyrometer 250 and a second pyrometer 350 are also positioned above the mounting platform 260. The first pyrometer 250 and the second pyrometer 350 may be attached to moveable arms on the moveable frame 230 in order to target all areas of the wafer 100. The first pyrometer 250 and second pyrometer 350 are remote temperature sensors that determine the temperature of the first area 110 from the reflected light 220 that the first area 110 reflects or thermal radiation that the first area 110 emits and is received by the first pyrometer 250 or the second pyrometer 350, respectively. A beam splitter 320, such as a dichroic mirrored prism assembly, may be positioned to direct thermal radiation of different wavelengths from the first area 110 to the first pyrometer 250 and the second pyrometer 350. The first pyrometer 250 and the second pyrometer 350 may be connected to the controller 280.

In order to measure the local reflectivity of the first area 110 of the wafer 100, the controller 280 may aim the probe laser 200 at the first area 110 of the wafer 100 and set the power of the probe laser 200 by adjusting the voltage and current supplied to the probe laser 200. The controller 280 then activates the probe laser 200, which fires the laser beam 210 at the first area 110. The width of the laser beam 210 may be adjusted to precisely target the first area 110. The laser beam 210 is reflected by the first area 110 and the reflected light 220 is received and measured by the first pyrometer 250. In some embodiments, the reflected light 220 has a wavelength in a range of 600 nm to 1000 nm, such as about 638 nm, and passes through the beam splitter 320 to the first pyrometer 250.

The reflectivity of the first area 110 may be determined by the controller 280 from the reflected light 220 measured by the first pyrometer 250. For example, the laser beam 210 and the reflected light 220 may have S polarization, for which the change in amplitude between the laser beam 210 and the reflected light 220 may be calibrated by using a known reflectivity of bare silicon for S polarized light, such as about 47%, and a reflectivity at the melt point of silicon, such as about 78%, to establish a dark level offset for a linear relation between the change in amplitude between the laser beam 210 and the reflected light 220 and the reflectivity of the first area 110.

Figure 3C:
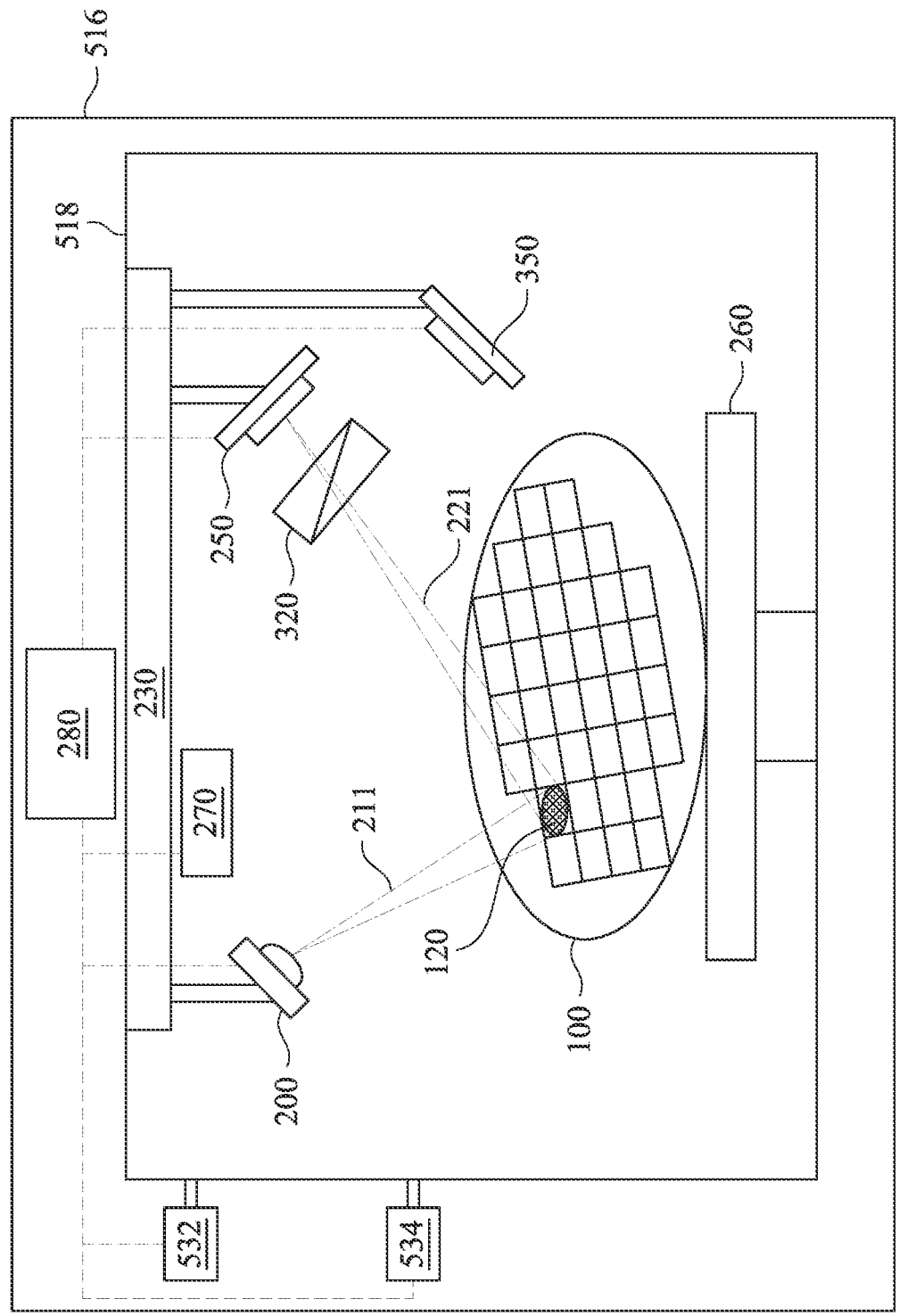

In FIG. 3C, after measuring the reflectivity of the first area 110, the reflectivities of other areas of the wafer 100 are measured. For example, the controller 280 may aim the probe laser 200 and the first pyrometer 250 at the other areas of the wafer 100 such as e.g. the second area 120 of the wafer 100 and set the power of the probe laser 200 by adjusting the voltage and current supplied to the probe laser 200. A laser beam 211 aimed at the second area 120 and the reflected light 221 from the second area 120 immediately after the laser beam 211 may be used to measure the reflectivity of the second area 120 by the same process described above for the first area 110 with respect to FIG. 3A. The reflectivities of the other areas of the wafer 100 may be measured subsequently by the same process.

The reflectivity measurements for each area of the wafer 100 may be stored in a database, such as a reflectivity map of the wafer 100, by the controller 280 in preparation for subsequent annealing steps. In some embodiments, the reflectivity measurements are stored in the database by mapping respective x and y coordinates of the wafer 100 with respective reflectivities of the wafer 100, and may be sorted by the areas with highest reflectivity, the largest proportional areas, and/or the areas of the wafer 100 comprising critical functions. However, any suitable method of storing the reflectivity measurements may be utilized.

Additionally, although the above description uses reflectivity as the input index stored in the database, the example of reflectivity is intended to be illustrative rather than limiting. Any suitable parameter for the input index may be used, such as e.g. reflectivity, emissivity, refractive index, extinction coefficient, pattern density on the wafer 100, film thickness on the wafer 100, the like, or a combination thereof.

In some embodiments, the annealing the wafer 100 is performed in situ in the process chamber 518 after the local reflectivities of the wafer 100 have been measured. In other embodiments, the wafer 100 is removed from the process chamber 518 and is transferred to a separate annealing chamber (not illustrated) for the annealing steps. The annealing chamber may be similar to the process chamber 518.

Figure 4A:
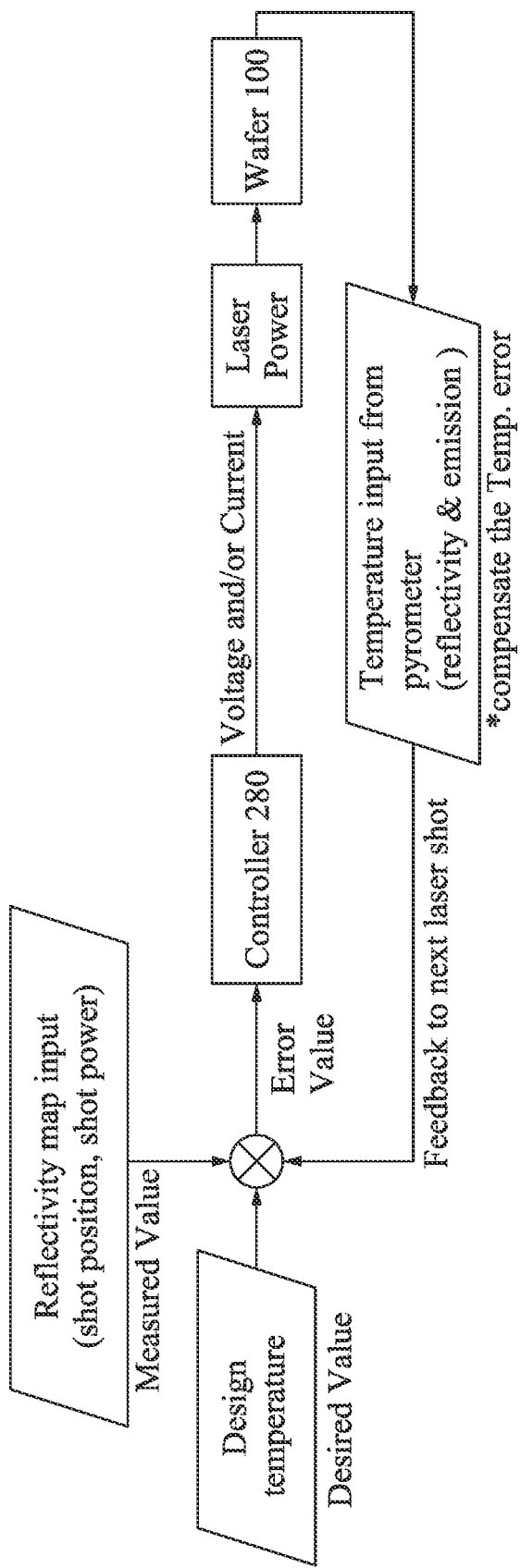
FIG. 4A illustrates a flow chart of a method of an annealing process, in accordance with some embodiments.

FIG. 4A is a flow chart illustrating a process for determining the power of laser shots and performing laser shots to areas of the wafer 100 after the local reflectivities of the wafer 100 have been measured. As illustrated by FIG. 4A, the power for a first laser shot 272 (not illustrated in FIG. 4A but illustrated and discussed further below with respect to FIG. 4B) on the first area 110 of the wafer 100 is determined by the controller 280 using the measured first reflectivity $R_1$ of the first area 110 (as measured and stored in a database as described with respect to FIGS. 3A and 3B above), an initial temperature $T_i$ of the first area 110 measured prior to performing the first laser shot 272, and a desired final anneal temperature $T_f$ of the first area 110.

In some embodiments, the initial temperature $T_{i1}$ of the first area 110 may be determined by e.g. measuring an ambient temperature in the process chamber 518, by controlling the temperature of the wafer 100 with a thermal controller included in the mounting platform 260, or by targeting the first area 110 prior to performing the first laser shot 272 and measure the initial temperature $T_i$. After the initial temperature $T_i$ is measured, it may be sent to and stored by the controller 280.

The desired value of the anneal temperature for the first area 110 is the design temperature, which may be chosen to improve properties of the first area 110 and/or devices formed on the first area 110. The desired final anneal temperature may be in a range of 800° C. to 1500° C. In some embodiments, the desired final anneal temperature may be the same across the wafer 100. In other embodiments, different areas of the wafer 100 may have different desired temperatures. The design temperature for the first area 110 may be stored in the database and retrieved by the controller 280.

The power and duration for the first laser shot 272 may be set by the controller 280 in order to attempt to achieve the desired final anneal temperature $T_{f1}$. The controller 280 determines the power and duration to produce a total energy $E_1$ for the first laser shot 272 from the measured first reflectivity $R_1$, the initial temperature $T_i$, and the desired final anneal temperature $T_f$.

Figure 4B:
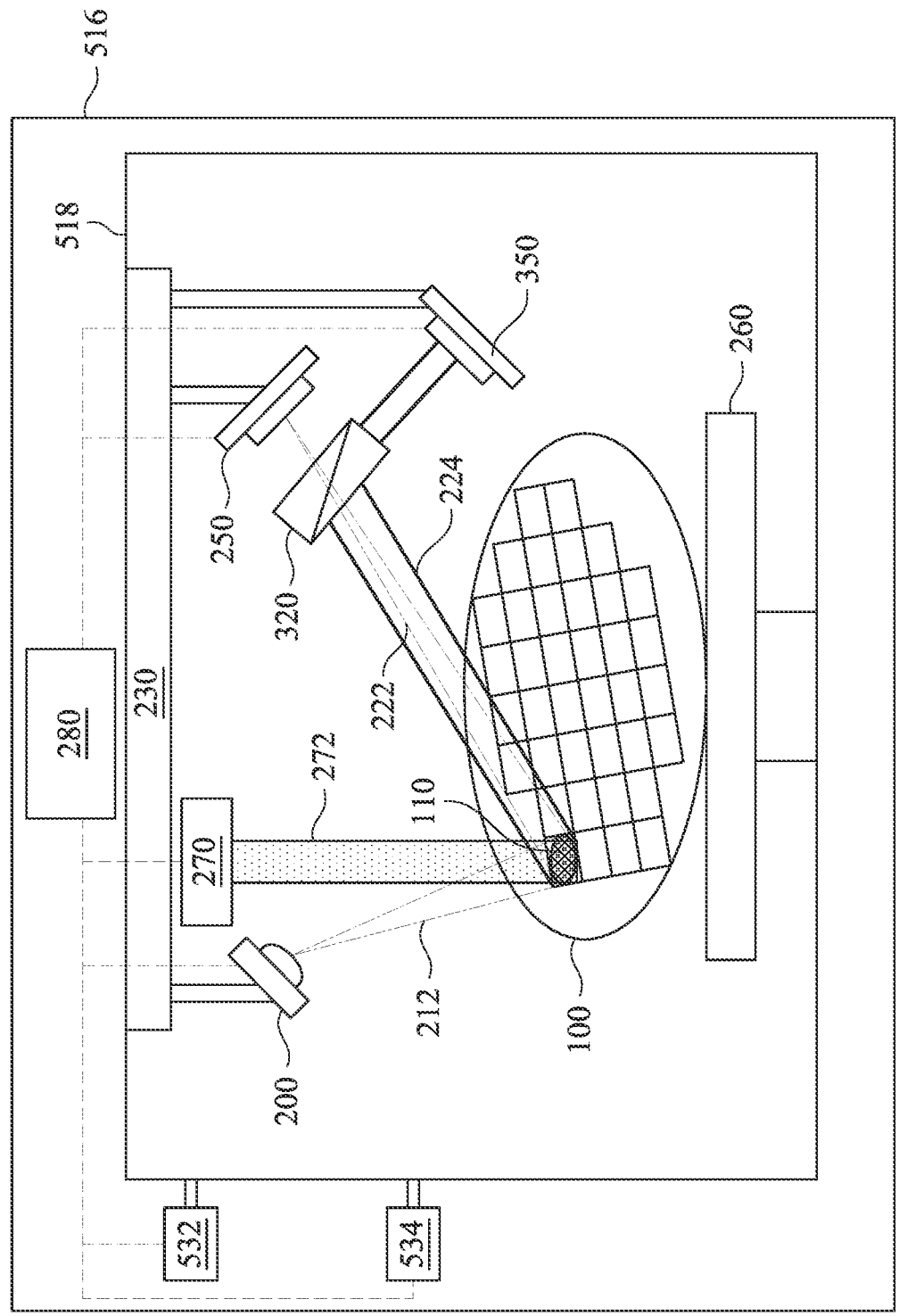
FIGS. 4B through 4D illustrate perspective views of intermediate steps in an annealing process, in accordance with some embodiments.

In FIG. 4B, the first laser shot 272 is performed by the laser generator 270. The controller 280 positions the wafer 100 to align the laser generator 270 with the first area 110 and sets the power and duration of the first laser shot 272 to provide the total energy $E_1$. The power of the first laser shot 272 may be set by adjusting the voltage and current delivered to the laser generator 270. After the first laser shot 272, the first area 110 reaches a subsequent temperature $T_{s1}$.

During or after the first laser shot 272, thermal radiation 224 is emitted from the first area 110. In some embodiments this thermal radiation 224 may have wavelengths in a range of 800 nm to 3000 nm, and may pass through the beam splitter 320 and then be directed towards the second pyrometer 350, where it is measured. The time resolved emissivity (TRE) signal S measured by the second pyrometer 350 may be used by the controller 280 to more accurately determine the relation between the reflectivity of the first area 110 and the change in temperature due to the total energy $E_1$ of the first laser shot 272.

In some embodiments, the controller 280 instructs the probe laser 200 to fire another laser beam (e.g., laser beam 212) at the first area 110 after the first laser shot 272 is performed, such as about 1 second after the first laser shot 272 is performed. Reflected light 222 from the laser beam 212 may pass through the beam splitter 320 to the first pyrometer 250 to measure the reflectivity $R_1(T_{s1})$ of the first area 110 at the subsequent temperature $T_{s1}$, which may be useful because the reflectivity $R_1(T_{s1})$ of the first area 110 may be temperature dependent.

Returning now to FIG. 4A, the subsequent temperature $T_{s1}$ can be determined by the controller 280 using equation (1) obtained from the spectral radiance of a black body:

$$T_{s1} = \frac{A(\lambda)}{\ln\left(1 + B(\lambda)\frac{\varepsilon(\lambda, T_{s1})}{S}\right)} \quad \text{Eq. (1)}$$

In Eq. 1, S is the TRE signal S measured by the second pyrometer 350 from the thermal radiation 224, $\varepsilon(\lambda, T_{s1})$ is the emissivity of the first area 110 which is $1-R_1(T_{s1})$, $A(\lambda)$ is $$\frac{hc}{\lambda K},$$

and $B(\lambda)$ is $$\frac{2hc^2 \cdot G \cdot \tau \cdot \Delta\lambda \cdot R(\lambda)}{\lambda^5},$$

where h is Planck's constant, c is the speed of light in a vacuum, K is the Boltzmann constant, $\lambda$ is the central wavelength of the thermal radiation 224, $\Delta\lambda$ is the spectrum range of the thermal radiation 224, $R(\lambda)$ is the spectral sensitivity of the second pyrometer 350, $\tau$ is the total optical transmission of the system, and G is the éendue of the optical system. The subsequent temperature $T_{s1}$ is then used by back to the controller 280 to help determine the power for a second laser shot 282 (see below, FIG. 4C) on the first area 110 of the wafer 100. The controller 280 uses the feedback of the subsequent temperature $T_{s1}$ to determine the total energy $E_2$ of the second laser shot 282. The total energy $E_2$ is the product of the power and duration for the second laser shot 282, which may be set by the controller 280 in order to achieve the desired final anneal temperature $T_f$.

Figure 4C:
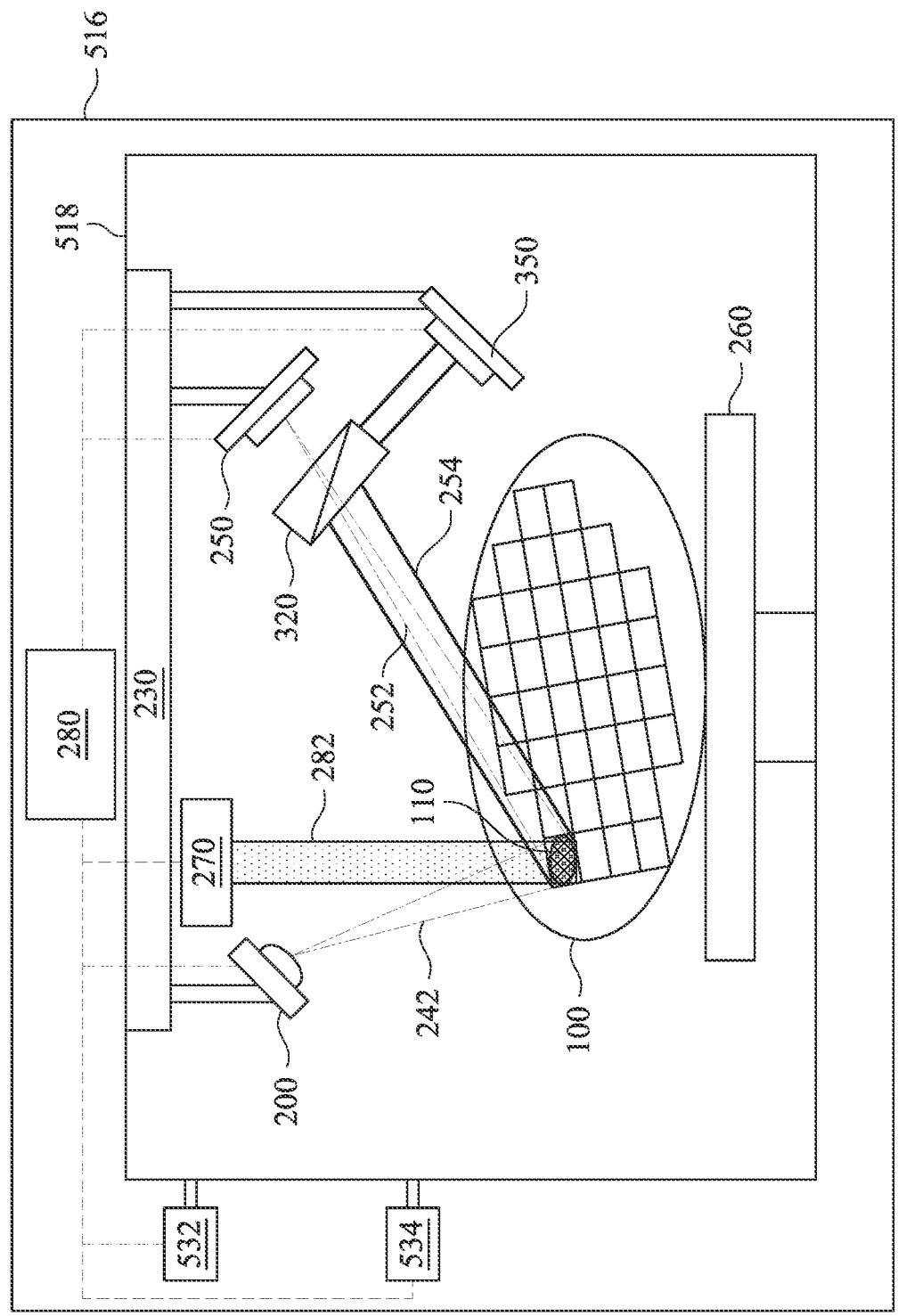

In FIG. 4C, the second laser shot 282 is performed by the laser generator 270. The controller 280 positions the laser generator 270 over the first area 110 and sets the power and duration of the second laser shot 282 to provide a total energy $E_2$. The power of the second laser shot 282 may be set by adjusting the voltage and current delivered to the laser generator 270. In some embodiments, the controller 280 instructs the probe laser 200 to fire a laser beam 242 at the first area 110 during or after the second laser shot 282 is performed, such as about 1 second after the second laser shot 282 is performed, in order for the reflected light 252 to be measured by the first pyrometer 250 and used to obtain a more accurate subsequent temperature $T_{s2}$ in conjunction with the thermal radiation 254 from the first area 110 measured by the second pyrometer 350.

Additional laser shots may be performed on the first area 110 by determining the power and duration of additional laser shots and then performing them on the first area 110. Feedback from each previous laser shot may be used to adjust the power and duration of each subsequent laser shot and/or used to update the reflectivity. In some embodiments, the additional laser shots are performed until the laser annealing of the first area 110 is complete, such as when the desired final temperature $T_f$ is reached.

Figure 4D:
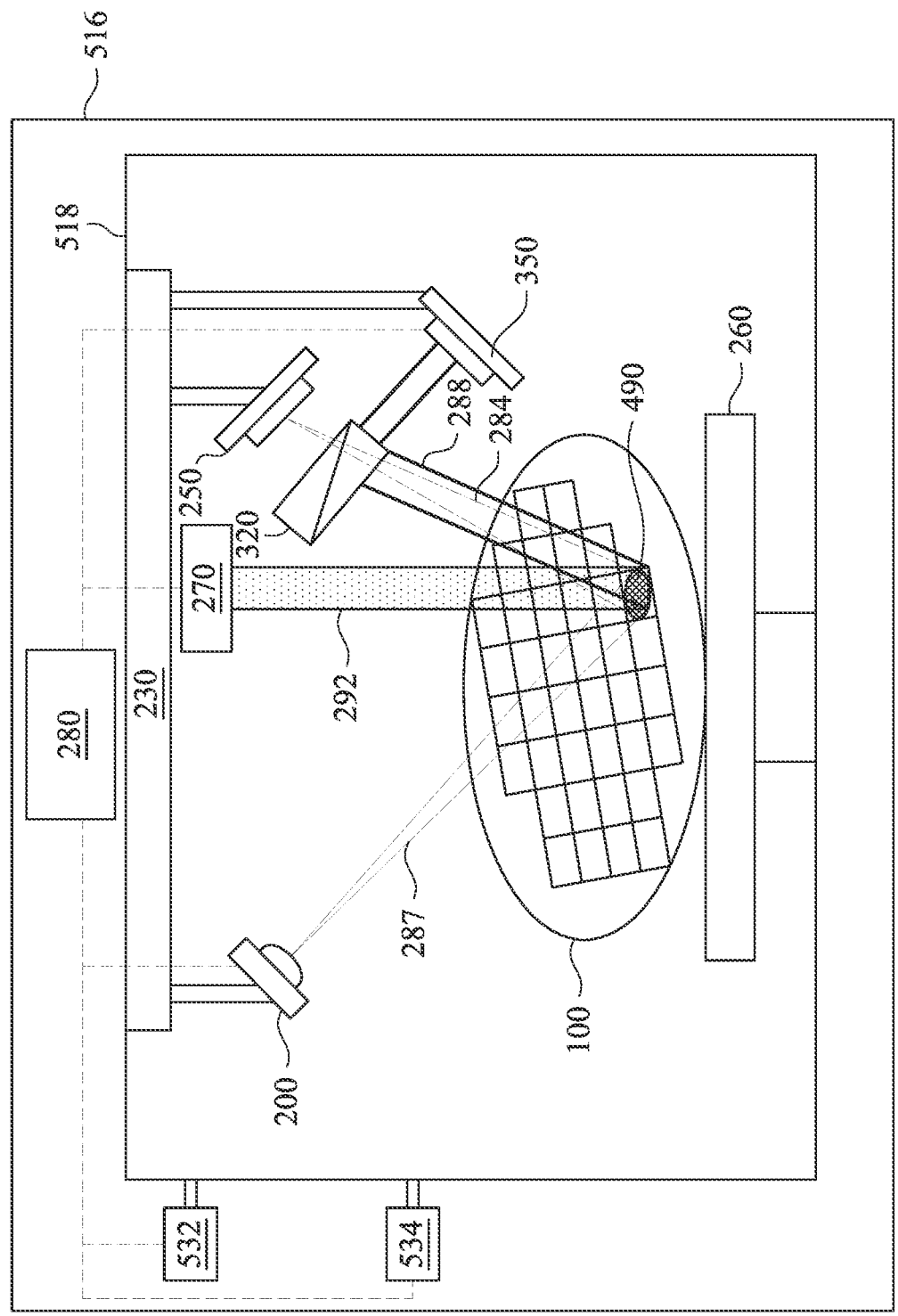

In FIG. 4D, the process described above with respect to FIGS. 4B and 4C is sequentially repeated for the other areas of the wafer 100, including the Nth area 490 to receive the anneal treatment. The controller 280 may aim the laser generator 270, the probe laser 200, the first pyrometer 250, and the second pyrometer 350 at each subsequent area of the wafer 100, such as e.g. the Nth area 490. In each step, the process of determining the power and duration of subsequent laser shots such as the subsequent laser shot 292, performing them, measuring the subsequent thermal radiation 288, firing a laser beam 287 in order to use the reflected light 284 to find the temperature dependent reflectivity of the Nth area 490, and finding the subsequent temperature of the Nth area 490 may be similar to the process described above with respect to the first area 110 with the substitution of performing them on subsequent areas. The process may continue until desired annealing temperatures are achieved in each area across the wafer 100.

Additionally, in the embodiments in which the reflectivity of a subsequent area such as e.g. the Nth reflectivity $R_N$ of the Nth area 490 is greater than the first reflectivity $R_1$ of the first area 110, the total energy $E_N$ of the subsequent laser shot 292 used on the Nth area 490 may be greater than the total energy $E_1$ of the first laser shot 272. In a particular embodiment, the durations of the first laser shot 272 and the subsequent laser shot 292 used on the Nth area 490 are the same and the power of the first laser shot 272 is less than the power of the subsequent laser shot 292 used on the Nth area 490. However, any suitable powers and durations may be utilized.

Figure 5:
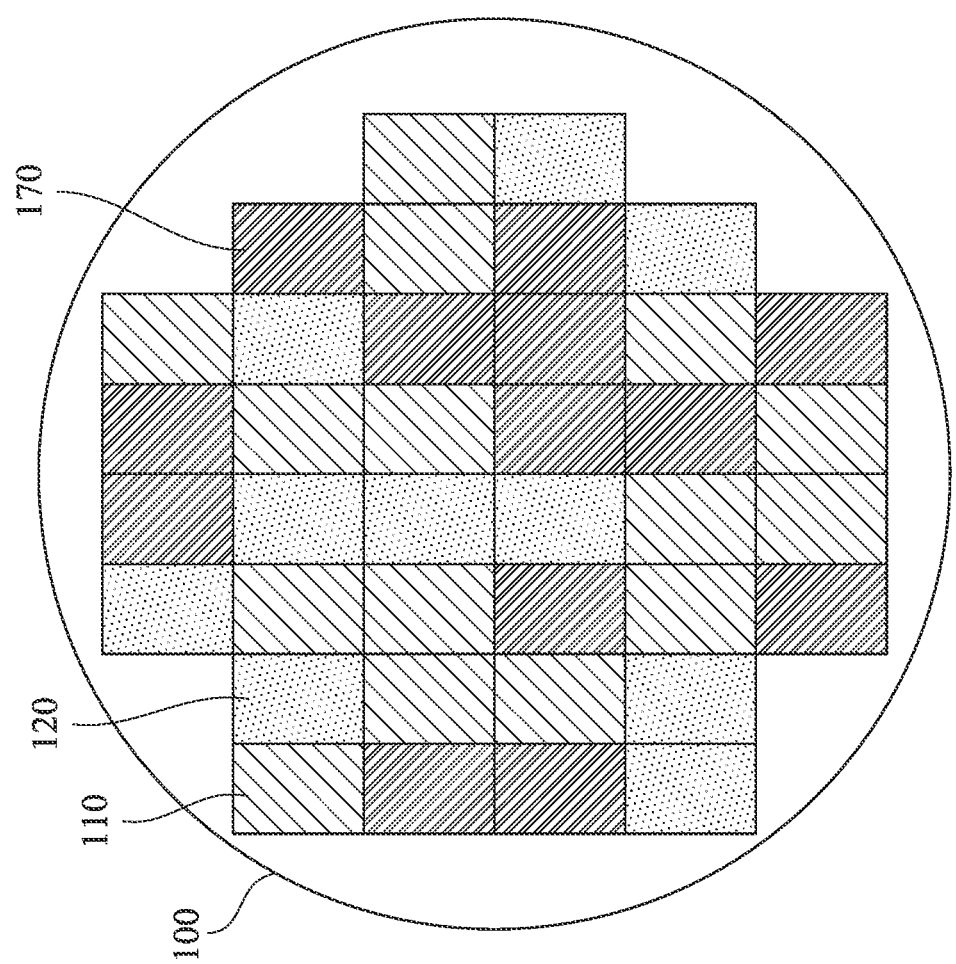
FIG. 5 illustrates a top view of a wafer, in accordance with some embodiments.

FIG. 5 illustrates the wafer 100 after the process described above with respect to FIGS. 3A to 4D has been performed, in accordance with some embodiments. By using measurements of the reflectivities of the areas of the wafer 100 to adjust the power of the laser shots used on each respective area, the areas of the wafer 100 have been annealed to temperatures all being within a desired final anneal temperature range, such as e.g. a range of 800° C. to 1500° C. For example, the first area 110 may have a first temperature T1, the second area 120 may have a second temperature T2 higher than T1, and the seventh area 170 may have a third temperature T3 higher than T2, with the temperatures T1, T2, and T3 all within the desired final anneal temperature range. Achieving a uniform temperature in the desired final anneal temperature range across the wafer 100 may be useful for improving properties of the wafer 100 and/or devices formed on the wafer 100, such as restoring the crystalline structure of the wafer 100 or improving the quality of films such as e.g. oxides formed on the wafer.

After the process described above with respect to FIGS. 3A to 5 has been performed, the wafer 100 may be removed from the process chamber 518 by the handler 512 and moved to the cooling station 520. In some embodiments, the wafer 100 is allowed to cool for a predetermined time by the controller 280, after which the controller 280 instructs the handler 512 to move the wafer 100 to the loading station 502. In other embodiments, the temperature of the wafer 100 may be measured by a temperature sensor such as a pyrometer (not illustrated) connected to the controller 280 until the temperature of the wafer 100 drops below a predetermined value. Once the temperature of the wafer 100 is below the predetermined value, the controller 280 instructs the handler to move the wafer 100 to a loading station 502.

Figure 6A:
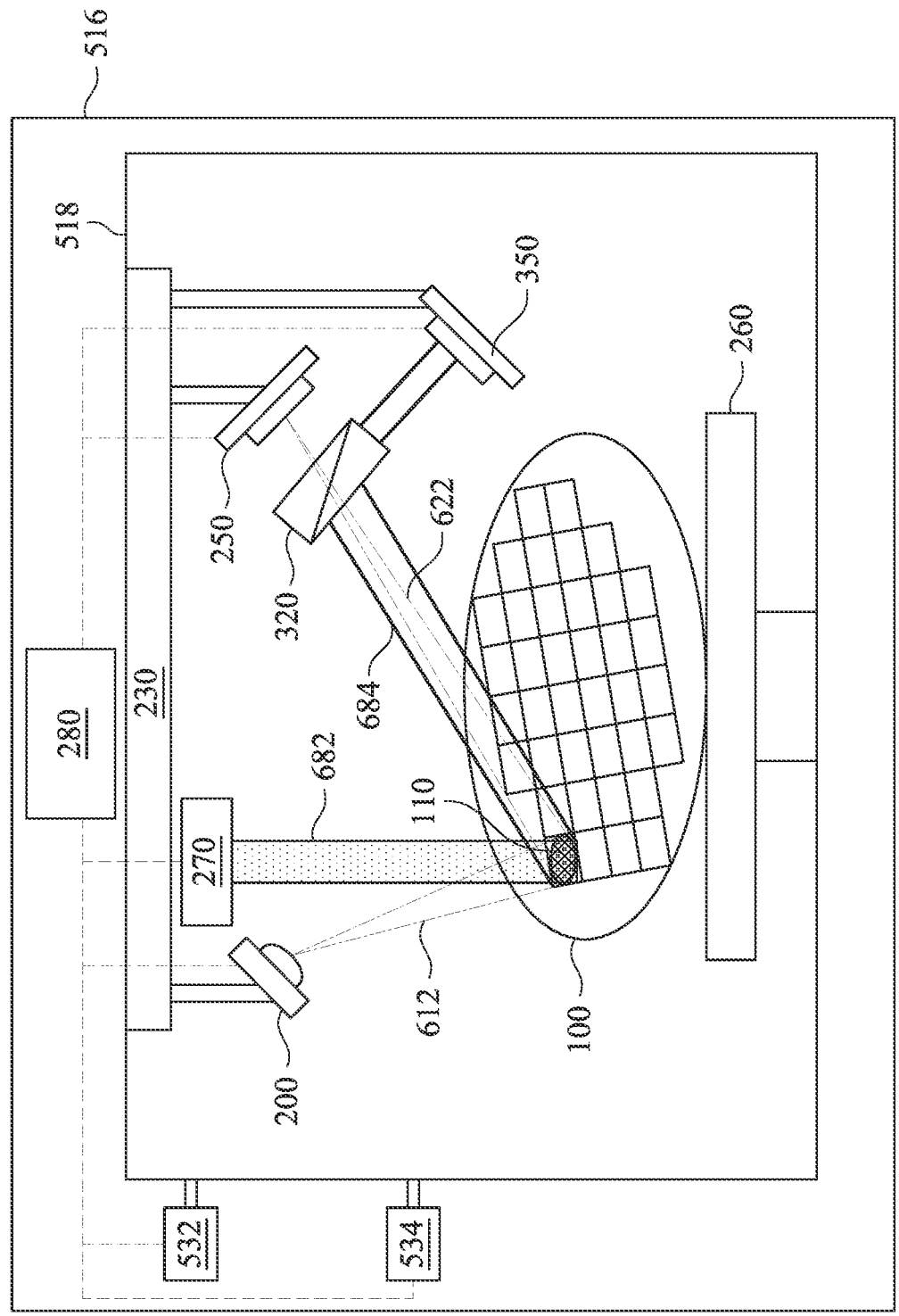
FIGS. 6A through 6C illustrate perspective views of intermediate steps in an annealing process, in accordance with some embodiments.
Figure 6B:
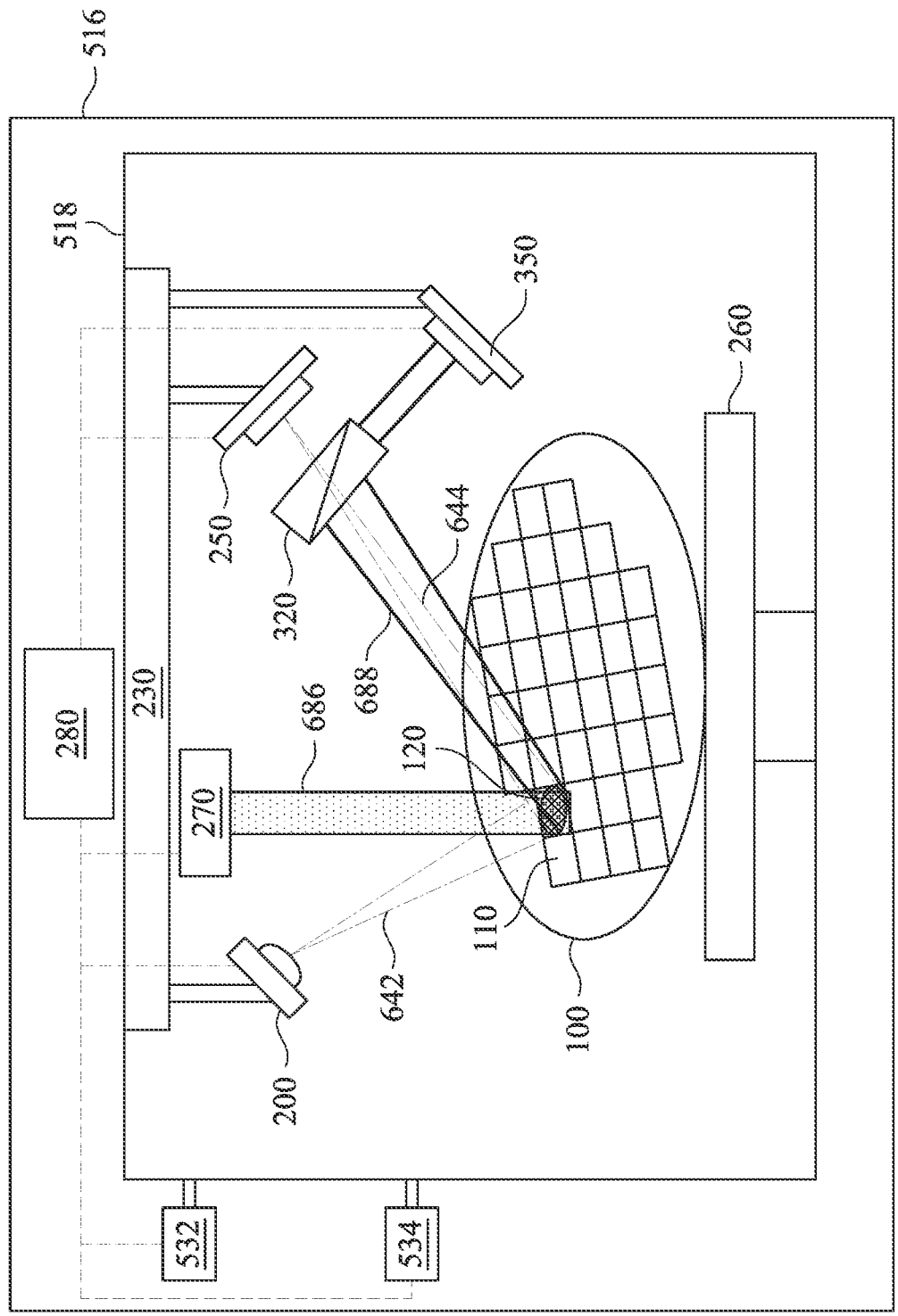
Figure 6C:
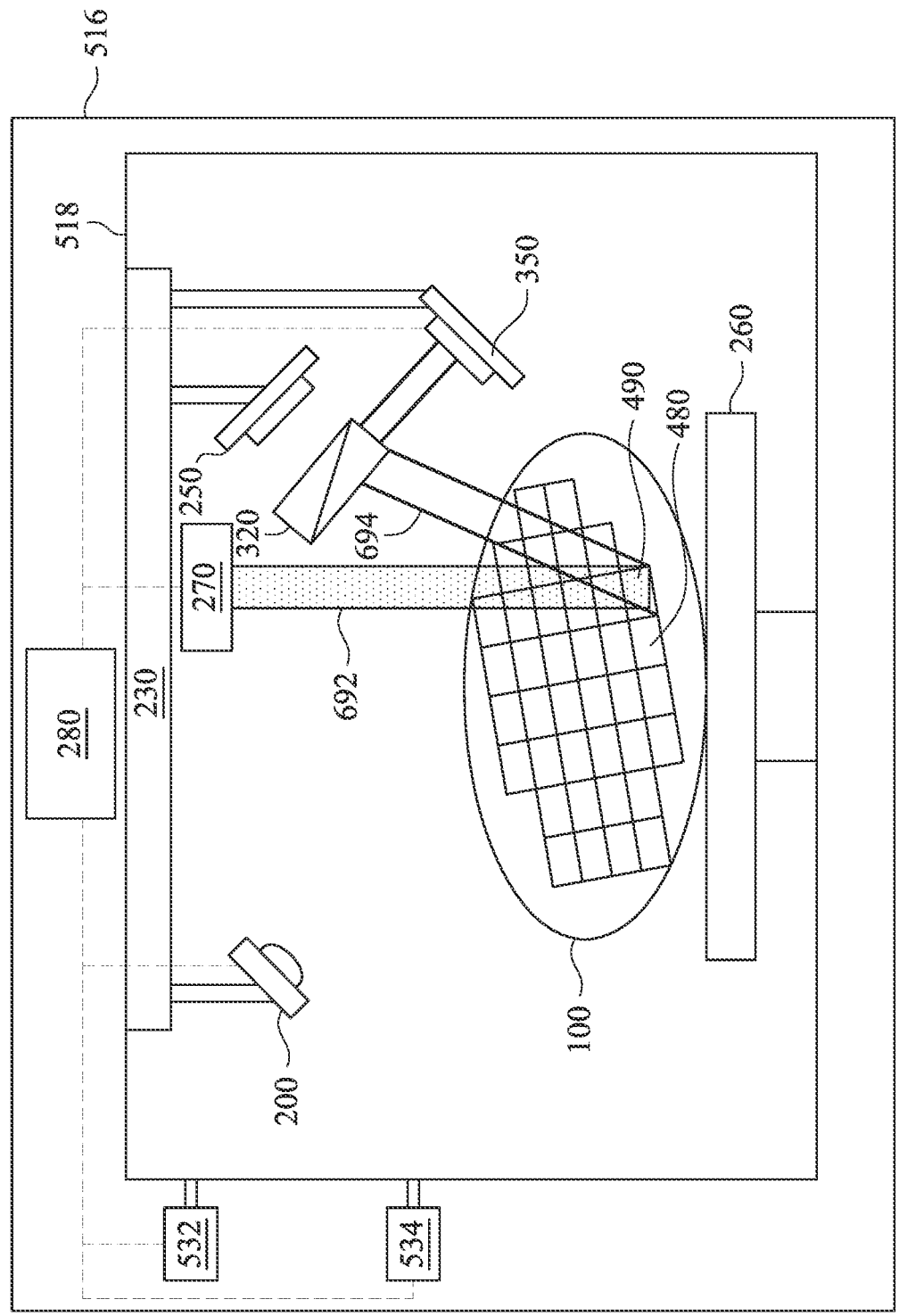

FIGS. 6A through 6C illustrate another method of annealing the wafer 100 to a uniform temperature by calibrating the power of laser shots on annealing regions of the wafer 100 with feedback. In this embodiment, however, the calibration is performed using information measured from neighboring annealing regions of the wafer 100 instead of the same anneal region. By using feedback from neighboring annealing regions of the wafer 100, desired temperatures may be reached with greater precision.

In this embodiment, the power and duration for a first laser anneal 682 on the first area 110 of the wafer 100 may be determined by the controller 280 using a similar method as the power for the first laser shot 212 as described above with respect to FIG. 4B.

In FIG. 6A, the first laser anneal 682 is performed by the laser generator 270. The controller 280 positions the laser generator 270 above the first area 110 and sets the power and duration of the first laser anneal 682 to provide the total energy $E_1$. The power of the first laser anneal 682 may be set by adjusting the voltage and current delivered to the laser generator 270.

Next, the power for a second laser anneal 686 (see below, FIG. 6B) on a second area 120 of the wafer 100 is determined. The controller 280 may find the temperature error between the subsequent temperature $T_s$ of the first area 110 and the desired final anneal temperature $T_f$ of the first area 110 by using the thermal radiation 684 measured by the second pyrometer 350 and the reflected light 622 from a laser beam 612 reflected off of the first area 110 and measured by the first pyrometer 250 to find the subsequent temperature $T_s$ of the first area 110 by a similar method as described above with respect to FIG. 4A. This temperature input may provide error information on the temperature dependency of the reflectivity $R_1$ of the first area 110, which can be used to adjust the expected temperature dependent reflectivity $R_2$ of the second area 120. The adjusted reflectivity $R_2$ can be used with the initial temperature $T_i$ of the second area 120, the desired final temperature $T_f$ of the second area 120, to calculate the total energy $E_2$ of the second laser anneal 686 to achieve a second subsequent temperature $T_{s2}$ closer to the desired final temperature $T_f$ of the second area 120.

In FIG. 6B, the second laser anneal 686 is performed by the laser generator 270. The controller 280 positions the laser generator 270 above the second area 120 and sets the power and duration of the second laser anneal 686 to provide the total energy $E_2$. The power of the second laser anneal 686 may be set by adjusting the voltage and current delivered to the laser generator 270. The controller 280 may find the temperature error between the subsequent temperature $T_{s2}$ of the second area 120 and the desired final anneal temperature $T_{f2}$ of the second area 120 by using the thermal radiation 688 measured by the second pyrometer 350 and the reflected light 644 from a laser beam 642 reflected off of the second area 120 and measured by the first pyrometer 250 to find the subsequent temperature $T_{s2}$ of the second area 120 by a similar method as described above with respect to FIG. 4A.

As illustrated in FIG. 6C, the steps of determining the power for subsequent laser shots on subsequent areas and performing the subsequent laser shots on the subsequent areas may be repeated to an Nth laser anneal 692 on an Nth area 490. The power for the Nth laser anneal 692 on the Nth area 490 of the wafer 100 is determined by the controller 280 using the measured reflectivity $R_N$ (schematically shown as 694) of the Nth area 490 (as measured and stored in the database described in respect to FIG. 3B above), the initial temperature $T_i$ of the Nth area 490 determined or measured prior to performing the Nth laser anneal 692, the desired final anneal temperature $T_f$ of the Nth area 490, and the measured subsequent temperature $T_{s(N-1)}$ of the (N-1)th area 480, which was annealed prior to determining the power for the Nth laser anneal 692.

The process for determining the power for the Nth laser anneal 692 may be similar to the process for determining the power for the second laser anneal 686 (see above, FIG. 6B) with the substitution of using the feedback of the measured subsequent temperature $T_{s(N-1)}$ of the (N-1)th area 480 instead of the measured subsequent temperature Tis of the first area 110. The controller 280 may compare the determined subsequent temperature $T_{s(N-1)}$ of the (N-1)th area 480 to the desired final anneal temperature $T_{fN}$. This temperature input may provide information on the temperature dependency of the reflectivity $R_{N-1}$ of the (N-1)th area 480, which can be used to adjust the temperature dependent reflectivity $R_N$ of the Nth area 490. The adjusted reflectivity $R_N$ can be used to more accurately calculate the total energy $E_N$ of the Nth laser anneal 692 to achieve an Nth subsequent temperature $T_{sN}$ closer to the desired final temperature $T_{fN}$ of the Nth area 490.

In FIG. 6C, the Nth laser anneal 692 is performed by the laser generator 270. The controller 280 positions the laser generator 270 above the Nth area 490 and sets the power and duration of the Nth laser anneal 692 to provide the total energy $E_N$. The power of the Nth laser anneal 692 may be set by adjusting the voltage and current delivered to the laser generator 270. In some embodiments, the Nth area 490 is the last area of the wafer 100 to be annealed.

Figure 7A:
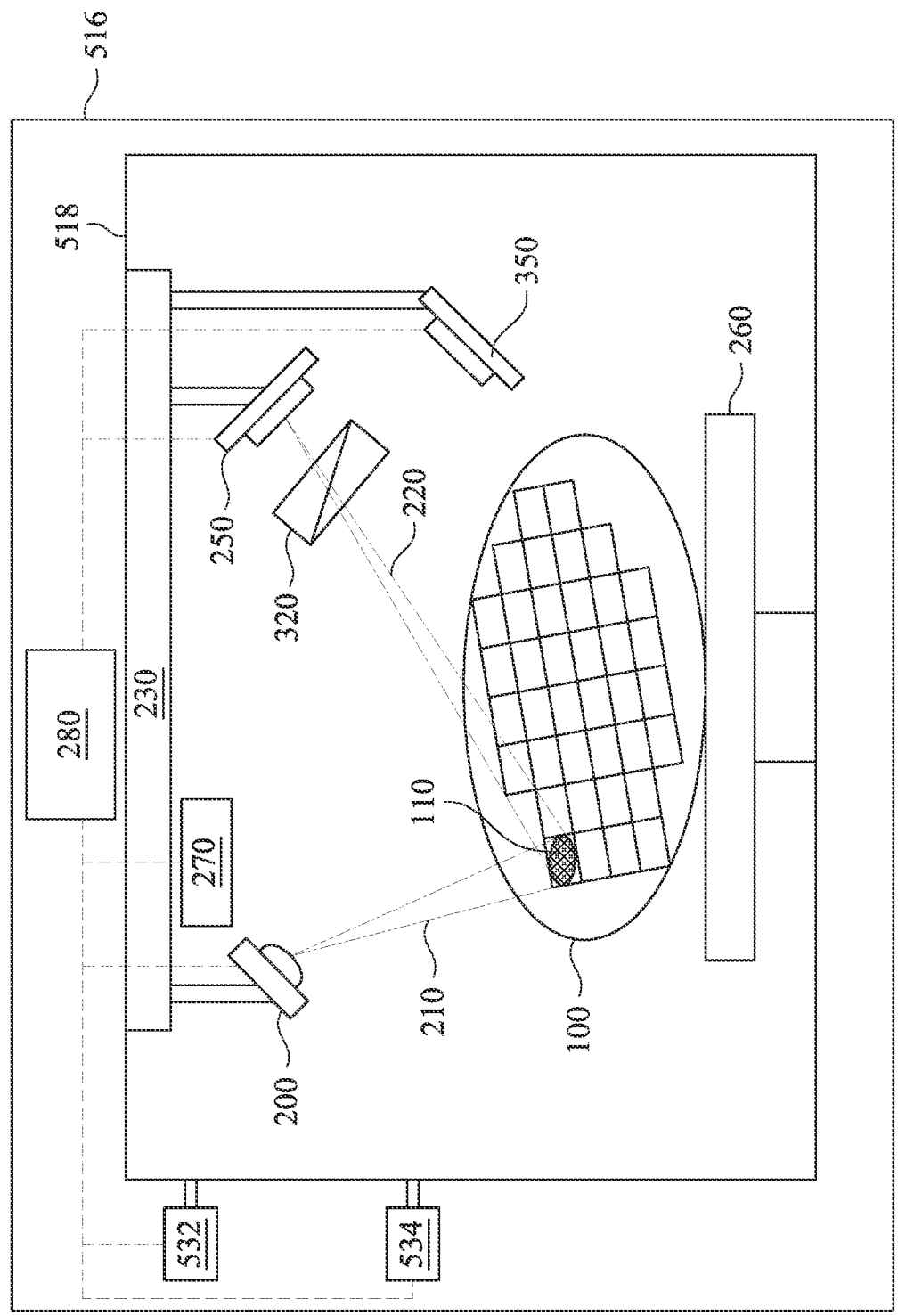
FIGS. 7A and 7B illustrate perspective views of intermediate steps in a measurement process, in accordance with some embodiments.
Figure 7B:
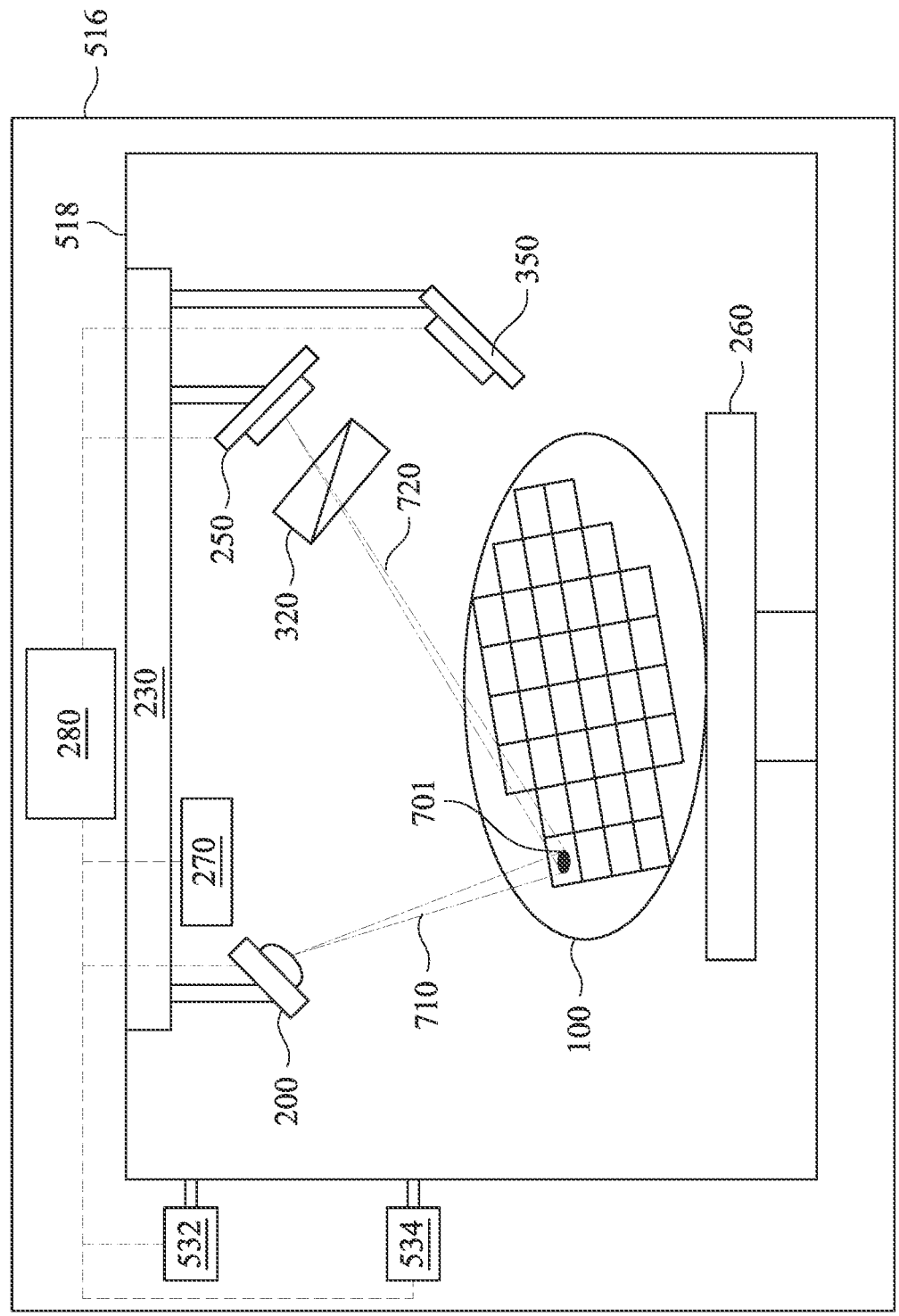

FIGS. 7A and 7B illustrate laser beams 210 and 710 performed on a single region (e.g., the first area 110), wherein the laser beam 210 is utilized to measure the reflectivity of the whole first area 110 and wherein the laser beam 710 is utilized to measure the reflectivity of a smaller sub-region 701 within the first area 110, which is located within the first area 110 but is a smaller region of the first area 110. In a particular embodiment the sub-region 701 may be a functional portion of the die, such as a CPU region or GPU region. However, any suitable region or portion of the first area 110 may be utilized. For example, the spot size of the smaller sub-region 701 can be equal to subsequently singulated dies, such as e.g. in a range of 6 cm² to 12 cm², can be equal to the size of functional chips such as CPUs, GPUs, or the like, such as e.g. in a range of 10 mm² to 1000 mm², or can be equal to a size smaller than functional chips (e.g., a part of a chip), such as e.g. in a range of 10 µm² to 10000 µm². However, any suitable size may be utilized.

Figure 7C:
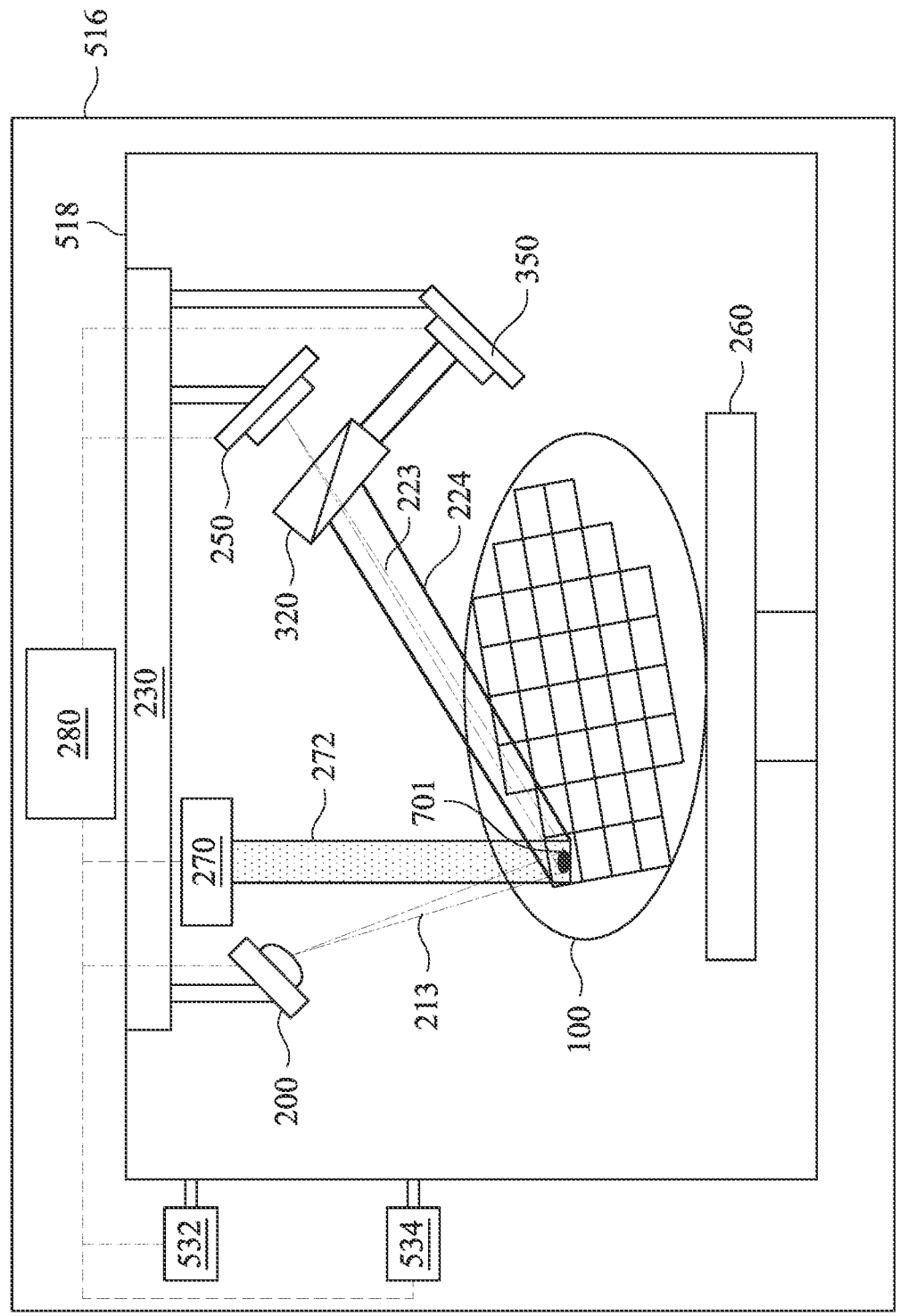
FIGS. 7C and 7D illustrate perspective views of intermediate steps in an annealing process, in accordance with some embodiments.
Figure 7D:
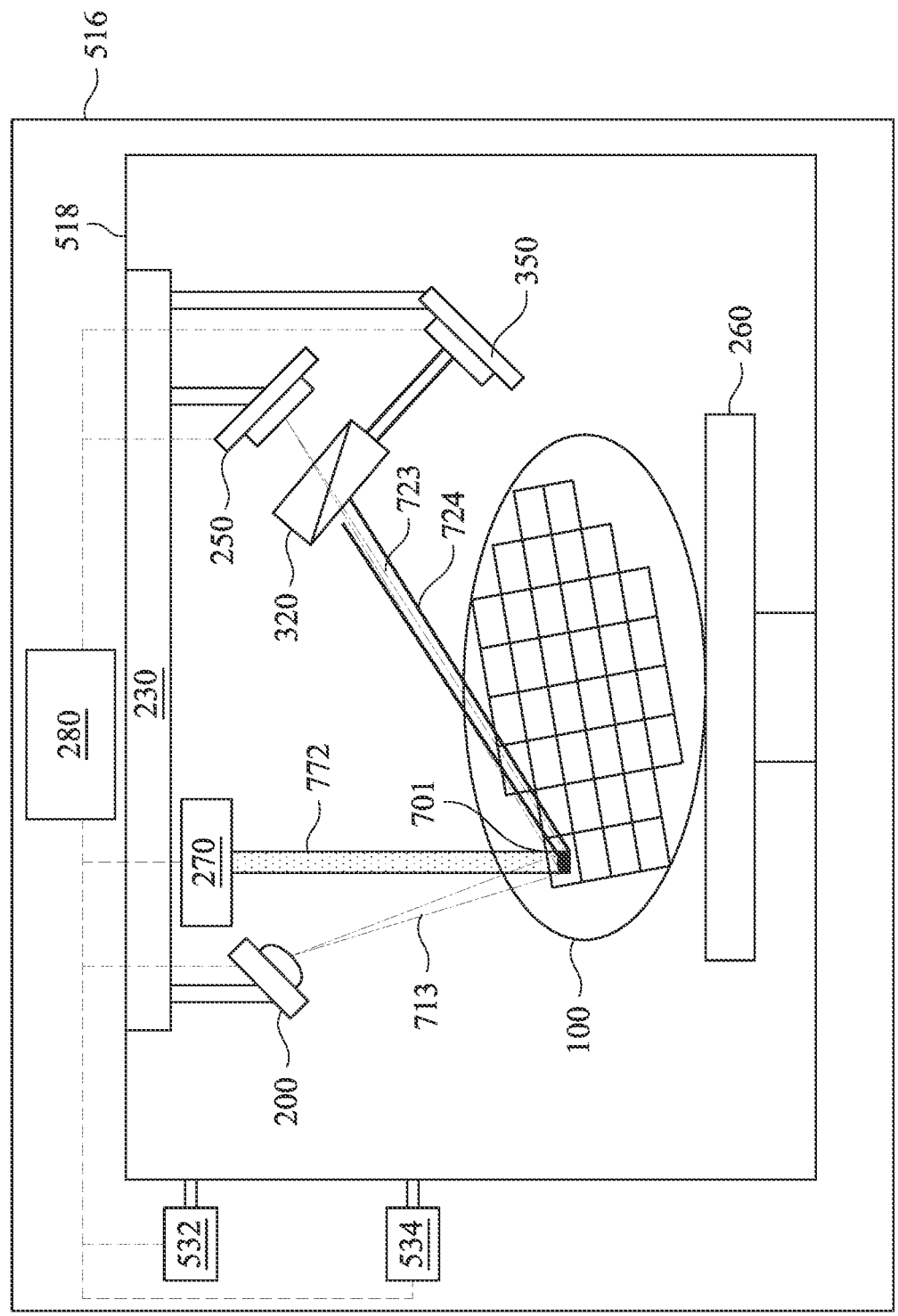

FIGS. 7C and 7D illustrate a plurality of laser anneals that are performed on a single anneal region (e.g., the first area 110), wherein a first laser anneal (using, e.g., the first laser shot 272) is utilized to anneal the entire anneal region and wherein a subsequent laser anneal (using, e.g., a smaller laser shot 772) is utilized to anneal the smaller sub-region 701 within the single anneal region. In some embodiments, the first laser shot 272 may be performed as described above with respect to FIG. 4B (e.g., using the previously measured reflectivity $R_1$ to determine the power of the first laser shot 272 and then impinging the first laser shot 272 on the first area 110), but with a laser beam 713 targeting the smaller sub-region 701 so that the reflected light 724 (along axis 723) can be used to find the subsequent temperature of the smaller sub-region 701 with Eq. 1. However, any suitable process for performing the first laser shot 272 may be utilized.

FIG. 7D illustrates that, once the first laser shot 272 has been performed, a smaller laser shot 772 is performed that impinges the smaller sub-region 701. In an embodiment the smaller sub-region 701 may be annealed using the smaller laser shot 772 with a similar procedure as used for the second laser shot 282 as described above with respect to FIGS. 3A-6C. For example, the power and duration of the smaller laser shot 772 may be determined using feedback from measurement of the temperature of the first area 110 after the first laser shot 272 using a similar method as described above in respect to FIGS. 4A-D. However, any suitable method for performing the smaller laser shot 772 may be utilized.

Figure 7E:
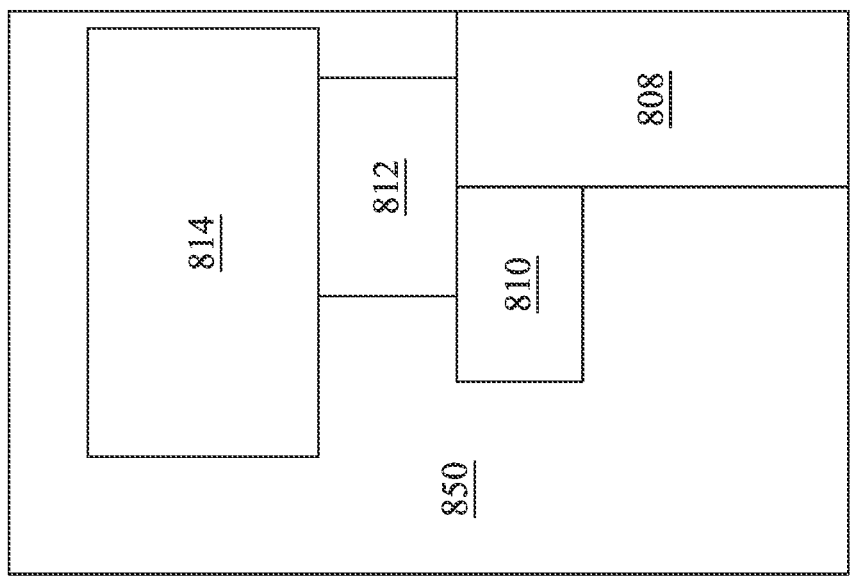
FIG. 7E illustrates a top view of a die, in accordance with some embodiments.

FIG. 7E illustrates a top down view of a die 850 which may be measured and annealed using the process described above with respect to FIGS. 7A-7D. As illustrated, while the entire die 850 may be annealed with the first laser shot 272, a number of smaller regions (e.g., a first sub-region 808, a second sub-region 810, a third sub-region 812, and/or a fourth sub-region 814) are each individually annealed using a plurality of the smaller laser shots 772 (e.g., one or more of the second laser shots 282 determined and tuned for each of the sub-regions). In some embodiments, sub-regions are individually annealed by a single laser shot tuned to cover the entire respective sub-region. In other embodiments, sub-regions are individually annealed by multiple laser shots, wherein each laser shot is tuned to cover a portion of the respective sub-region. In a particular embodiment, the first sub-region 808 may be a CPU region (with, e.g., a low reflectivity), the second sub-region 810 may be a memory region including, for example, an SRAM array (with, e.g., a high reflectivity), the third sub-region 812 may be a system on chip region (with, e.g., a moderate reflectivity), and the fourth sub-region 814 may be a GPU region (with, e.g., a moderate reflectivity). However, any suitable combination of regions may be utilized. Sub-regions with low reflectivity (e.g., CPU regions) may be annealed with smaller laser shots 772 having less power than the smaller laser shots 772 used to anneal the sub-regions with high reflectivity (e.g., memory regions).

By targeting smaller areas with the smaller laser shots 772, the power and duration of each subsequent smaller laser shot 772 may be adjusted to achieve more uniform final temperatures. For example, areas within the CPU (e.g., the first sub-region 808) may be annealed with laser shots having relatively lower total energy, areas within the GPUs (e.g., the fourth sub-region 814) and SoCs (e.g., the third sub-region 812) may be annealed with laser shots having relatively moderate total energy, and areas within the SRAM arrays (e.g., the second sub-region 810) may be annealed with laser shots having relatively higher total energy. This may be useful for uniformly improving properties of the various features of the area.

In some embodiments, the method of laser anneals performed on smaller areas within dies illustrated in accordance with FIGS. 7A-E may be performed with the annealing tool 500 (see above, FIG. 3A) in conjunction with the method described in respect to FIGS. 4A-D or in conjunction with the method described in respect to FIGS. 6A-C. Using these methods, a desired area of the wafer 100 may be laser annealed to a uniform temperature within a desired temperature range.

Figure 8:
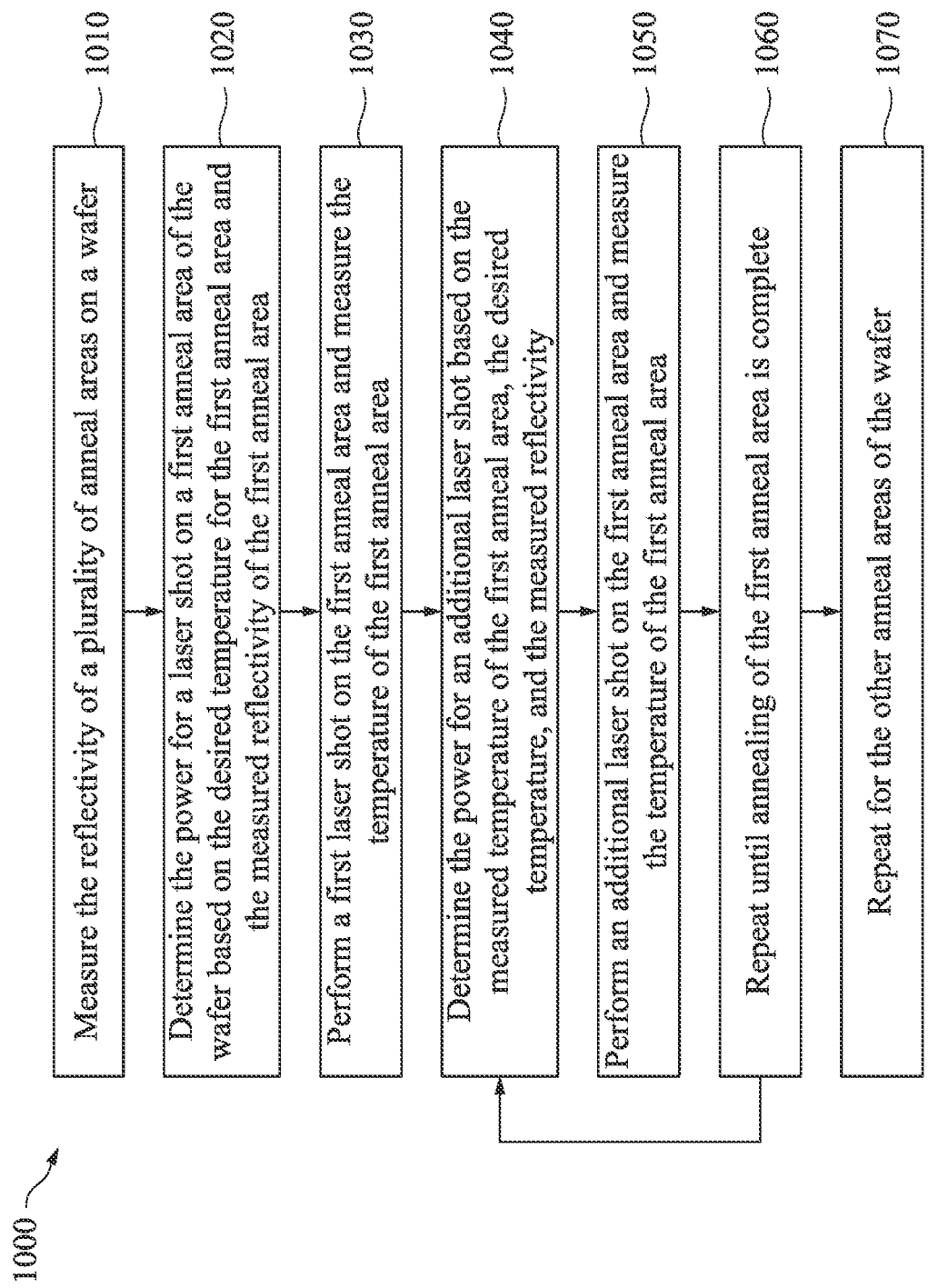
FIG. 8 illustrates another flow chart of a method of an annealing process, in accordance with some embodiments.

FIG. 8 shows a flow chart illustrating a method 1000 of measuring local reflectivities of the wafer 100 and annealing the wafer 100 to a uniform temperature with multiple laser shots, in accordance with some embodiments. By using multiple laser shots on the same regions of the wafer 100, desired temperatures may be reached with greater precision. The method 1000 may use the annealing tool 500 for measuring the respective reflectivities of a plurality of anneal regions on the wafer 100 and then annealing each anneal region to the desired temperature.

In step 1010, the respective reflectivities of the plurality of areas on the wafer 100 are measured, as described in respect to FIGS. 3A and 3B above. In step 1020, the power and duration for the first laser shot 272 on the first area 110 of the wafer 100 is determined based on the desired temperature for the first area 110 and the measured reflectivity of the first area 110, as described in respect to FIG. 4A above. In step 1030, the first laser shot 272 is performed and the subsequent temperature of the first area 110 is measured, as described in respect to FIG. 4B above. In step 1040, the power for the additional laser shot 282 is determined based on the measured temperature of the first area 110, the desired temperature for the first area 110, and the measured reflectivity of the first area 110, as described in respect to FIG. 4B above. In step 1050, the additional laser shot 282 is performed on the first area 110 and the temperature of the first area 110 is subsequently measured, as described in respect to FIG. 4B above. In step 1050, steps 1040 and 1050 may be repeated by determining the power and duration of additional laser shots and then performing them on the first area 110. Feedback from each previous laser shot may be used to adjust the power and duration of each subsequent laser shot, as described above with respect to FIG. 4D.

In step 1070, steps 1100 through 1060 are repeated for the other areas of the wafer 100. The controller 280 may position the laser generator 270, the probe laser 200, the first pyrometer 250, and the second pyrometer 350 to target each subsequent area of the wafer 100. The following steps of determining the power and duration of the subsequent laser shots and performing them may be similar to the steps 1100 through 1060 described above with the substitution of performing them on subsequent areas. The process may continue until desired annealing temperatures are achieved in areas across the wafer 100.

Figure 9:
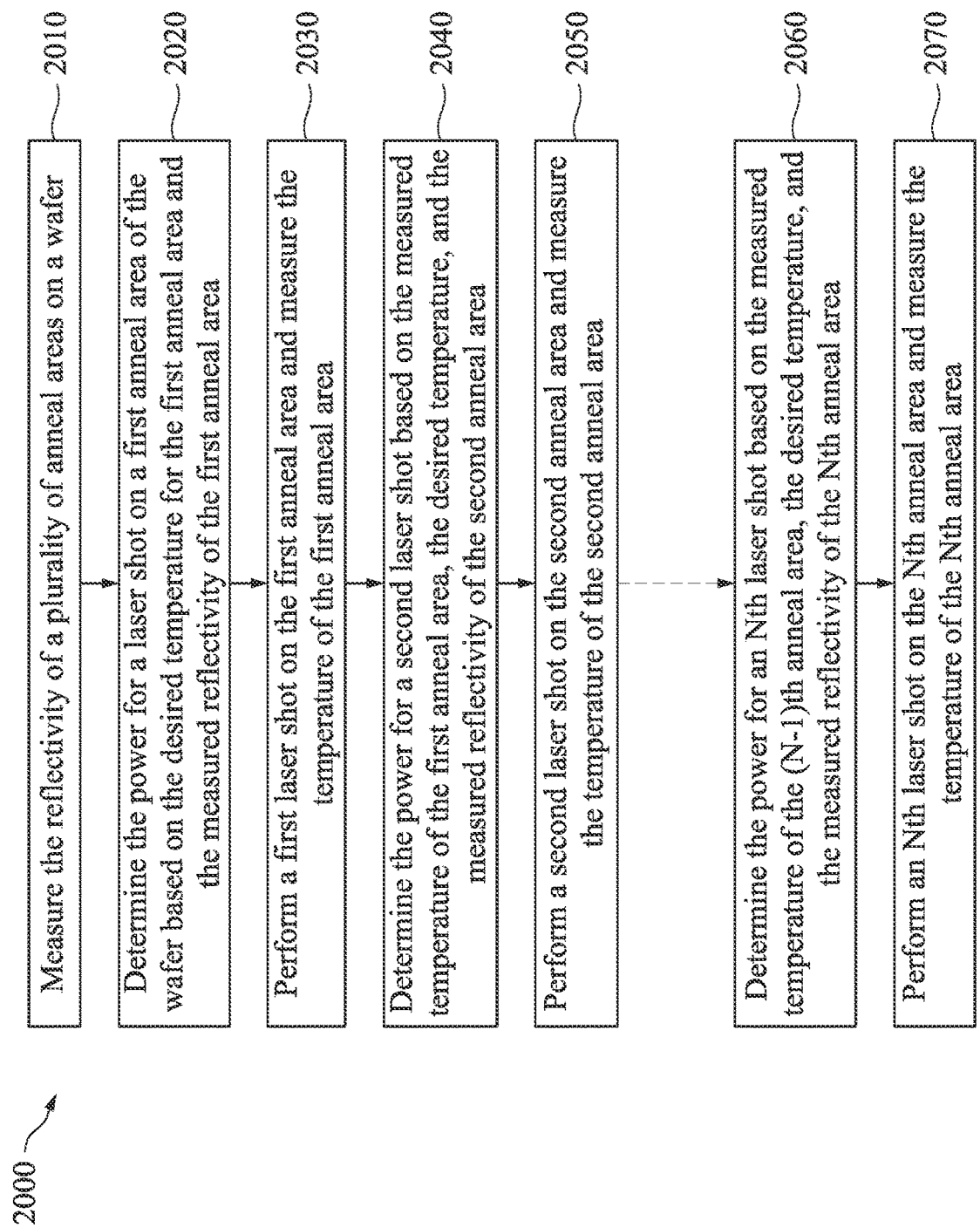
FIG. 9 illustrates another flow chart of a method of an annealing process, in accordance with some embodiments.

FIG. 9 shows a flow chart illustrating a method 2000 of measuring local reflectivities of a wafer 100 and annealing the wafer 100 to a uniform temperature with laser shots using feedback from neighboring anneal regions, in accordance with some embodiments. By using feedback from neighboring anneal regions, desired temperatures may be reached with greater precision. The method 2000 may use the annealing tool 500 for measuring the respective reflectivities of a plurality of anneal regions on the wafer 100 and then annealing each anneal region to the desired temperature.

In step 2010, the respective reflectivities of the plurality of areas on the wafer 100 are measured, as described in respect to FIGS. 3A and 3B above. In step 2020, the power and duration for the first laser anneal 682 on the first area 110 of the wafer 100 is determined based on the desired temperature for the first area 110 and the measured reflectivity of the first area 110, as described in respect to FIG. 4A above. In step 2030, the first laser anneal 682 is performed and the subsequent temperature of the first area 110 is measured, as described in respect to FIG. 6A above.

In step 2040, the power for the second laser anneal 686 on the second area 120 is determined based on the measured temperature of the first area 110, the desired temperature, and the measured reflectivity of the second area 120, as described in respect to FIG. 6A above. In step 2050, the second laser anneal 686 is performed on the second area 120 and the subsequent temperature of the first area 110 is measured, as described in respect to FIG. 6B above.

The steps of determining the power for subsequent laser shots on subsequent areas and performing the subsequent laser shots on the subsequent areas may be repeated to an Nth laser anneal 692 on an Nth area 490. In step 2060, the power for an Nth laser anneal 692 on the Nth area 490 is determined based on the measured temperature of the (N−1)th area 480, the desired temperature, and the measured reflectivity of the Nth area 490, as described in respect to FIG. 6B above. In step 2070, the Nth laser anneal 692 is performed on the Nth area 490 and the subsequent temperature of the Nth area 490 is measured, as described in respect to FIG. 6C above.

Embodiments may achieve advantages. Desired heating of wafers across wafer regions with different reflectivities, such as uniform heating, may be achieved by a wafer annealing system using temperature feedback from a pyrometer to adjust the energy of laser shots to compensate for different reflectivities across the surfaces of the wafers. The reflectivities of different areas of the wafer may be mapped prior to laser annealing. Multiple laser shots may be used on the same areas of a wafer, using temperature feedback from earlier laser shots to adjust the power and duration of subsequent laser shots. The laser shots may be targeted to small areas within the surfaces of subsequently singulated dies, which may be useful for compensating for the different reflectivities of features such as CPUs, GPUs, SoCs, and SRAM memory arrays within single dies. The flow integration window of the anneal process may be enlarged by this approach.

In accordance with an embodiment, a method of manufacturing a semiconductor device includes: determining a first reflectivity of a first anneal region on a wafer; determining a second reflectivity of a second anneal region on the wafer; performing a first laser shot on the first anneal region, wherein a power of the first laser shot is set in accordance with the first reflectivity; measuring a first temperature of the first anneal region; and performing a second laser shot on a second anneal region, wherein a power of the second laser shot is set in accordance with the second reflectivity and the first temperature of the first anneal region. In an embodiment, the first anneal region is different from the second anneal region. In an embodiment, the first anneal region is the same as the second anneal region. In an embodiment, the method further includes: measuring a second temperature of the second anneal region; and performing a third laser shot on a third anneal region, wherein a power of the third laser shot is set in accordance with a desired temperature for the third anneal region, a third reflectivity of the third anneal region, and the second temperature of the second anneal region. In an embodiment, the first reflectivity is less than the second reflectivity. In an embodiment, the power of the first laser shot is less than the power of the second laser shot. In an embodiment, the measuring the first reflectivity and the performing the first laser shot are performed in a same process chamber. In an embodiment, the measuring the first reflectivity and the performing the first laser shot are performed in different process chambers. In an embodiment, the second anneal region is a subset of the first anneal region.

In accordance with another embodiment, a method of manufacturing a semiconductor device includes: performing a measuring process on a wafer, wherein the measuring process includes: impinging a first laser on a first anneal region on the wafer; and determining a first reflectivity of the first anneal region with a pyrometer; determining a first power setting for a first laser shot on the first anneal region using the first reflectivity; performing the first laser shot on the first anneal region with the first power setting; measuring a temperature of the first anneal region after performing the first laser shot; determining a second power setting for a second laser shot on the first anneal region using the first reflectivity and the temperature of the first anneal region; and performing the second laser shot on the first anneal region with the second power setting. In an embodiment, the measuring process further includes: impinging a second laser on an additional anneal region on the wafer; and determining an additional reflectivity of the additional anneal region with the pyrometer. In an embodiment, the method further includes annealing the additional anneal region, the annealing the additional anneal region including: determining a first additional power setting for a first additional laser shot on the additional anneal region using the additional reflectivity of the additional anneal region; performing a first additional laser shot on the additional anneal region with the first additional power setting; measuring an additional temperature of the additional anneal region; determining a second additional power setting for a second additional laser shot on the additional anneal region using the additional reflectivity of the additional anneal region and the additional temperature of the additional anneal region; and performing the second additional laser shot on the additional anneal region with the second additional power setting. In an embodiment, the first anneal region is a CPU region and the additional anneal region is a memory region. In an embodiment, the first laser shot has a higher power than the first additional laser shot.

In accordance with yet another embodiment, a method of manufacturing a semiconductor device includes: inserting a wafer into an annealing system; moving the wafer to a process chamber using a robot; determining a first reflectivity of a first anneal region on the wafer and determining a second reflectivity of a second anneal region on the wafer using a controller; annealing the first anneal region with a first laser shot, wherein a power of the first laser shot is set by the controller using the first reflectivity; measuring a temperature of the first anneal region and feeding the temperature of the first anneal region back to the controller; and annealing the second anneal region with a second laser shot, wherein a power of the second laser shot is set by the controller using the second reflectivity and the temperature of the first anneal region. In an embodiment, the method further includes recording the first reflectivity and the second reflectivity in a database. In an embodiment, each entry in the database includes an x coordinate, a y coordinate, and a reflectivity index. In an embodiment, the determining the first reflectivity and the second reflectivity is performed using a probe laser and a pyrometer. In an embodiment, the second anneal region is a smaller region within the first anneal region. In an embodiment, the second anneal region is a CPU region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   determining a first reflectivity of a first anneal region on a wafer;
   determining a second reflectivity of a second anneal region on the wafer, wherein the second anneal region is located within but has a lesser area than the first anneal region;
   after determining the first reflectivity and the second reflectivity, performing an initial laser shot on the first anneal region and the second anneal region, wherein a power of the initial laser shot on the first anneal region is set in accordance with the first reflectivity;
   after performing the initial laser shot on the first anneal region and the second anneal region, measuring a first temperature of the first anneal region; and
   after determining the first reflectivity and the second reflectivity, performing an initial laser shot on the second anneal region, wherein a power of the initial laser shot on the second anneal region is set in accordance with the second reflectivity and the first temperature of the first anneal region.

2. The method of claim 1, wherein the first anneal region is a die region and wherein the second anneal region is a functional portion of the die region.

3. The method of claim 1, further comprising:
   measuring a second temperature of the second anneal region; and
   performing an initial laser shot on a third anneal region, wherein a power of the initial laser shot on the third anneal region is set in accordance with a desired temperature for the third anneal region, a third reflectivity of the third anneal region, and the second temperature of the second anneal region.

4. The method of claim 1, wherein the first reflectivity is less than the second reflectivity.

5. The method of claim 4, wherein the power of the initial laser shot on the first anneal region is less than the power of the initial laser shot on the second anneal region.

6. The method of claim 1, wherein the measuring the first reflectivity and the performing the initial laser shot on the first anneal region are performed in a same process chamber.

7. The method of claim 1, wherein the measuring the first reflectivity and the performing the initial laser shot on the first anneal region are performed in different process chambers.

8. The method of claim 1, wherein the step of measuring the first temperature of the first anneal region measures only the temperature of the second anneal region portion of the first anneal region.

9. A method of manufacturing a semiconductor device, the method comprising:
   performing a measuring process on a wafer, wherein the measuring process comprises:
      impinging a first laser on a first anneal region on the wafer and on a second anneal region of the wafer, the second anneal region being different from the first anneal region; and
      determining a first reflectivity of the first anneal region and a second reflectivity of the second anneal region with a pyrometer;
   determining a first power setting for an initial laser shot on the first anneal region using the first reflectivity;
   performing the initial laser shot on the first anneal region with the first power setting;
   measuring a temperature of the first anneal region after the performing the initial laser shot;
   determining a temperature error value for the first anneal region based upon a difference between the temperature of the first anneal region and a desired temperature of the first anneal region;
   determining a second power setting for a subsequent laser shot on the first anneal region using the first reflectivity and the temperature of the first anneal region; and
   performing the subsequent laser shot on the first anneal region with the second power setting;
   determining a third power setting for a second initial laser shot on the second anneal region using the second reflectivity and the temperature error value for the first anneal region; and
   performing the second initial laser shot on the second anneal region with the third power setting.

10. The method of claim 9, further comprising:
    measuring a temperature of the second anneal region after the performing the second initial laser shot;
    determining a fourth power setting for a second subsequent laser shot on the second anneal region using the second reflectivity and the temperature of the first anneal region; and
    performing the second subsequent laser shot on the second anneal region with the fourth power setting.

11. The method of claim 9, wherein the first anneal region is a CPU region and the second anneal region is a memory region.

12. The method of claim 11, wherein the initial laser shot has a higher power than the subsequent laser shot.

13. A method of manufacturing a semiconductor device, the method comprising:
    inserting a wafer into an annealing system;
    moving the wafer to a process chamber using a robot;
    determining a first reflectivity of a first anneal region on the wafer and determining a second reflectivity of a second anneal region on the wafer using a controller, wherein the second anneal region is within but has a lesser area than the first anneal region;
    after determining the first reflectivity of the first anneal region, annealing the first anneal region with an initial laser shot, wherein a power of the initial laser shot is set by the controller using the first reflectivity;
    measuring a temperature of the first anneal region and feeding the temperature of the first anneal region back to the controller; and annealing the second anneal region with an initial laser shot on the second anneal region, wherein a power of the initial laser shot on the second anneal region is set by the controller using the second reflectivity and a temperature error value obtained from the first anneal region.

14. The method of claim 13, further comprising recording the first reflectivity and the second reflectivity in a database.

15. The method of claim 14, wherein each entry in the database comprises an x coordinate, a y coordinate, and a reflectivity index.

16. The method of claim 13, wherein the determining the first reflectivity and the second reflectivity is performed using a probe laser and a pyrometer.

17. The method of claim 13, wherein the second anneal region is a smaller region within the first anneal region.

18. The method of claim 17, wherein the second anneal region is a CPU region.

* * * * *